United States Patent
Kim et al.

(10) Patent No.: US 7,339,211 B2
(45) Date of Patent: Mar. 4, 2008

(54) SEMICONDUCTOR DEVICE AND METHOD FOR FABRICATING THE SAME

(75) Inventors: Dong-Sauk Kim, Ichon-shi (KR); Ho-Seok Lee, Ichon-shi (KR); Byung-Jun Park, Ichon-shi (KR); Il-Young Kwon, Ichon-shi (KR); Jong-Min Lee, Ichon-shi (KR); Hyeong-Soo Kim, Ichon-shi (KR); Jin-Woong Kim, Ichon-shi (KR); Hyung-Bok Choi, Ichon-shi (KR); Dong-Woo Shin, Ichon-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 156 days.

(21) Appl. No.: 10/625,277

(22) Filed: Jul. 23, 2003

(65) Prior Publication Data

US 2005/0018525 A1    Jan. 27, 2005

(30) Foreign Application Priority Data

Nov. 18, 2002   (KR)   .................. 10-2002-0071644
Dec. 30, 2002   (KR)   .................. 10-2002-0086189

(51) Int. Cl.
*H01L 27/148* (2006.01)
*H01L 29/768* (2006.01)

(52) U.S. Cl. .............. 257/249; 257/296; 438/587; 438/588

(58) Field of Classification Search ............. 257/202, 257/249–250, 296, 326, 288; 438/587–588, 438/238–239, 241
See application file for complete search history.

(56) References Cited

U.S. PATENT DOCUMENTS

| 5,305,252 | A | | 4/1994 | Saeki |
| 6,150,214 | A | * | 11/2000 | Kaeriyama .................. 438/253 |
| 6,242,332 | B1 | * | 6/2001 | Cho et al. .................... 438/587 |
| 2002/0098654 | A1 | | 7/2002 | Durcan et al. ............... 438/267 |

FOREIGN PATENT DOCUMENTS

JP    04-229807    8/1992

(Continued)

OTHER PUBLICATIONS

Notice of Preliminary Rejection issued by Korean Intellectual Property Office dated Nov. 29, 2004.

(Continued)

*Primary Examiner*—Zandra V. Smith
*Assistant Examiner*—Thanh Y. Tran
(74) *Attorney, Agent, or Firm*—Marshall, Gerstein & Borun LLP

(57) ABSTRACT

Semiconductor devices and methods of manufacture thereof are disclosed that are capable of preventing a short of lower electrodes caused by a leaning or lifting phenomenon while forming the lower electrodes and securing enough capacitance of a capacitor by widening an effective capacitor area. The inventive semiconductor device includes: a plurality of capacitor plugs disposed in an orderly separation distance; and a plurality of lower electrodes used for a capacitor and disposed in an orderly separation distance to be respectively connected with the capacitor plugs.

21 Claims, 19 Drawing Sheets

FOREIGN PATENT DOCUMENTS

| | | |
|---|---|---|
| JP | 04-260040 | 9/1992 |
| JP | 06-077429 | 3/1994 |
| JP | 06-112429 | 4/1994 |
| KR | 1020000006493 A | 1/2000 |
| KR | 100268919 B1 | 7/2000 |
| KR | 1020050055077 A | 6/2005 |

OTHER PUBLICATIONS

Office Action for Chinese Application No. 200310116172.7 and English Translation thereof (6 pages).

* cited by examiner (A)

(B)

C-C'

D-D' e-e'

(A)

(B)

(A)

(B)

(A)

(B)

SEMICONDUCTOR DEVICE AND METHOD FOR FABRICATING THE SAME

TECHNICAL FIELD

A semiconductor memory device is disclosed that includes a lower electrode for a capacitor. A method for fabricating the same is also disclosed.

DESCRIPTION OF RELATED ART

Recently, a variety of technologies for improving charge storage capacity has been developed as the size of semiconductor devices is reduced. As a preferable choice, the capacitor has been formed as a three-dimensional (3D) structure. For example, a concave capacitor is a representative capacitor having the 3D structure.

FIGS. 1A to 1C are cross-sectional views showing a conventional method for fabricating a semiconductor device that includes a lower electrode.

As shown in FIG. 1A, a first insulation layer 11 that is an oxide based layer is formed over a semiconductor substrate 11. A first plug 12 is formed to be in contact with the semiconductor substrate 10 by penetrating the first insulation layer 11. The first plug gets to be in contact with an impurity diffusion area such as a source/drain region.

Herein, a tetra-ethyl-ortho-silicate (TEOS) material is used for forming the first insulation layer 11. In addition, the first plug 12 is formed with a poly-silicon material. Furthermore, to prevent a diffusion of an ohmic contact material and lower electrode material into the semiconductor substrate 10, a barrier layer with a $Ti/TiSi_2/TiN$ structure (not shown) is usually formed over the first plug 12.

A planarization process, so called a chemical mechanical polishing (CMP) process, is carried out to planarize an upper part of a layer comprising the first plug 12 and first insulation layer 11, and a second insulation layer 13 is formed over the planarized layer.

Bit lines 14 are formed on the second insulation layer 13. Herein, the bit lines 14 should not be overlapped with the first plug 12. In addition, a first etch stop layer 15 constituted with one of nitride based layers is thinly formed along an entire upper profile of the substrate.

The first etch stop layer 15 prevents losses of the bit lines 14 during a succeeding etching process for forming a storage node contact. Especially, a nitride based layer such as a silicon nitride layer or a silicon nitride oxide layer is used to obtain an etching selectivity to a third insulation layer 16 which is also an oxide based layer.

The third insulation layer 16 is thickly deposited over the first etch stop layer 15. Continuously, another planarization process is carried out to planarize an upper part of the third insulation layer 16 by using an etch-back method or the CMP process.

Next, a photo-resist pattern 17 for forming a storage node contact is formed.

In addition, a capacitor contact hole exposing the first plug 12 is formed by sequentially etching the third insulation layer 16, the first etch stop layer 15 and the second insulation layer 13 even if the capacitor contact hole is not illustrated. Herein, the photo-resist pattern 17 is used as an etching mask.

At this time, the third insulation layer 16 is etched through a first etching process and the first etching process stops before the first etch stop layer 15 is etched. Thereafter, the first etch stop layer 15 and the second insulation layer 11 are then etched through a second etching process again. A required etching profile can be obtained by varying an etching recipe for each of the first and second etching processes.

The capacitor contact hole is filled with a plug material such as a poly-silicon while the plug material is deposited over an entire upper part of the substrate. As a result, a second plug is formed and electrically gets to be in contact with the first plug. Another CMP process is carried out to perform a planarization process for an upper part of the semiconductor substrate which has gone through the predetermined processes.

Next, a second etch stop layer 19 that is a nitride based layer is formed to prevent the second plug 18 from being attacked during an etching process for a lower electrode which will be formed through a succeeding process. Continuously, a sacrifice insulation layer 20 constituted that is an oxide based layer is formed after determining the vertical height of the capacitor which will be formed over the second etch stop layer. The oxide layer used for forming the sacrifice insulation layer 20 can affect a capacity of the capacitor which will be formed. Next, another photo-resist pattern 21 is formed.

Herein, an extra process for forming the second etch stop layer could be skipped because the etching process for forming the lower electrode can be easily controlled.

The photo-resist pattern 21 used for etching the sacrifice insulation layer 20 is shown in FIG. 1B.

The photo-resist pattern 21 serves as an etching mask used for etching the sacrifice insulation layer 20.

The etching process for removing the sacrifice insulation layer is carried out. Herein, the etching process is held back by the second etch stop layer 19 once and then, begins to be carried out again. The second etch stop layer is also removed thereafter.

As a result, an open part, i.e., an exposed surface of the second plug 18 is formed.

After removing the photo-resist pattern 21, a conductive material for the lower electrode is formed along a whole surface with an open part formed by etching the sacrifice insulation layer 20. Consequently, the second plug 18 gets to be in contact with the conductive material.

Next, the photo-resist is deposited over the entire surface with the open part in order to cover the entire surface. Next, the entire surface of the substrate covered with the photo-resist is planarized by performing the etch-back process or the CMP process until the sacrifice insulation layer is exposed.

The exposed sacrifice insulation layer mentioned above is removed by a wet dip-out process using a buffered oxide etchant (BOE) or a hydrogen fluoride (HF) acid. Consequently, a lower electrode 22 with a concave structure shown in FIG. 1C is formed.

Continuously, a remnant photo-resist is removed by carrying out a dry strip process. At this time, O2/CF4/H2O/N2 or O2O/N2 is used for the dry strip process. Also, a solvent is used to clearly remove the remnant photo-resist and by-products generated during a cleaning process using a solvent.

As a next step, a heat treatment process is performed to recover a degraded property of the lower electrode 22 caused by the etching process. An extra cleaning process for removing remnant impurities is carried out by using the BOE prior to forming a dielectric layer.

Even though not illustrated, the capacitor is completely formed after forming the dielectric layer and an upper electrode over the lower electrode 22.

FIG. 2 is a top view illustrating a plurality of conventional lower electrodes.

For reference, FIG. 2 shows a two dimensional arrangement for the conventional lower electrodes.

Referring to FIG. 2, a plurality of lower electrodes 22 is arranged in one direction, and a plurality of second plugs 18 are disposed on between bit lines arranged in a matrix distribution. Each of the second plugs 18 is over-lapped to the adjacent second plug 18. Also, a plurality of lower electrodes 22 are disposed to be in contact with the second plugs 18, respectively.

Until recently, a mask pattern of a quadrilateral shape or an elliptical shape with a high ratio of a major axis and a minor axis is used to etch the sacrifice insulation layer 20. As a result, a concave type or a cylinder type of a lower electrode 22 pattern is formed. Concerning the mask pattern with an ellipse shape, its original plane feature is not the ellipse shape but a quadrilateral shape. The quadrilateral shape is changed to the ellipse shape after the etching process is carried out.

During the lower electrode 22 pattern formation, a leaning phenomenon of the lower electrode 22 takes place because of a surface tension of the HF acid or the BOE. Herein, the HF acid or the BOE is used to perform a dip-out process of the sacrifice insulation layer 20 for forming the lower electrode 22 shown in FIG. 1C. Furthermore, an electrical short of neighboring lower electrodes is caused by the leaning phenomenon mentioned above.

FIG. 3 is a cross-sectional view illustrating an electrical short of the neighboring lower electrodes. As the semiconductor device gets highly integrated, a distance between the neighboring lower electrodes gets narrower and thereby, frequently causing the leaning phenomenon illustrated in FIG. 3.

Accordingly, a line width of the lower electrode 22 becomes finer and therefore, the electrical short of the neighboring lower electrodes takes place more frequently as shown at 23.

The lower electrodes of the cylinder type capacitor has been arranged in the matrix distribution. The lower electrodes in accordance with an improved prior art are disposed in a zigzag distribution. Herein, two adjacent lower electrodes which are located at both sides of the bit line become a pair and each of the paired electrodes is disposed in a way that one of the paired lower electrodes is disposed ahead of the other in the X-axis imaginary line. Consequently, the lower electrodes are disposed in the aforementioned zigzag distribution.

As a result, a partial confrontation area, which is formed when the paired lower electrodes face each other in an opposite direction, is reduced and the aforementioned electrical short between the lower electrodes is prevented.

FIG. 4 is a top view of the semiconductor device including the lower electrodes in accordance with the improved prior art.

Referring to FIG. 4, a plurality of bit lines are formed in an X-direction. A plurality of X virtual axis having a direction, which is identical to the X-direction, and a plurality of Y virtual axis having a direction, which is vertical to the X-direction, are shown in FIG. 4. Herein, only two X virtual axis and only two Y axes imaginary lines, that is, X1 and X2, and Y1 and Y2 are shown in FIG. 4. Also, more Y-axis imaginary lines Y1', Y1", Y2'and Y2" are shown in FIG. 4.

The X virtual axis (X1, X2) and the Y virtual axis (Y1, Y2) cross each other and thus, a matrix structure or lattice structure having a plurality of inter-section points is obtained. Herein, midpoints of a plurality of capacitor plugs 41 are located at the inter-section points, and therefore, the capacitor plugs 41 are disposed in the matrix distribution.

More specifically, the capacitor plugs 41 are connected with the first plugs, which are in contact with an activation area of the semiconductor substrate. In addition, the capacitor plugs 41 are disposed within a predetermined interval 'd2', and the capacitor plugs 41 neighboring in the Y-direction are formed within a predetermined distance 'd1', which is same as a width of the bit line 40.

Each upper area of the capacitor plugs 41 is electrically connected with each lower electrode 42 in one-to-one correspondence, and the lower electrodes 42 neighboring in the X-direction within a predetermined interval d3.

Herein, along a Y virtual axis selected at discretion, for example, Y1 which passes through a midpoint of the capacitor plug 41, a pair of lower electrodes 42A and 42B neighbors each other and the paired lower electrodes are disposed on different but neighboring X virtual axis. Furthermore, as shown in FIG. 4, one of the paired lower electrodes 42A and 42B is disposed ahead of the other in view of the X-imaginary line.

Consequently, even if not illustrated, the interfacial tension caused by a wet etching solution used to remove a sacrifice insulation layer by performing the dip-out process after forming the lower electrode 42 is reduced by the zigzag distribution of the lower electrodes and thereby, the electrical short between the neighboring lower electrodes can be prevented by the above-mentioned arrangement for the lower electrodes 42.

However, as the semiconductor device is highly integrated, a drawback such as a reduced process margin required for securing a contact area for a plug still exists.

Such drawback as mentioned above still remains in the semiconductor devices conventionally fabricated.

The leaning phenomenon caused by the wet dip-out process for the sacrifice insulation layer is somewhat prevented by arranging the lower electrodes in the zigzag distribution. However, a problem with the method mentioned above still exists as the photo-resist pattern becomes extremely fine, and therefore, the separation distance between the lower electrodes gets closer.

In addition, the electrical short between the neighboring lower electrodes is generated by a lift of a lower electrode. Herein the lift of the lower electrode is one of causes collapse of the photo-resist pattern.

An etching process is performed along the major axis is different from an etching process is performed along the minor axis when the sacrificial insulation layer is a rectangular or elliptical shape having a high ratio of a major axis to a minor axis. As a result, an etching profile, which generates a tapering feature, is generated at the major axis, and therefore, an effective area for forming the lower electrode is reduced. Therefore, effective area for forming the capacitor is also reduced.

In addition, compared with a critical dimension of an upper plane of the structure mentioned above, that of a lower plane is reduced. Therefore, a bump such as a meta-stable poly silicon (MPS) used for increasing the capacitance can not be formed due to a short between bumps formed at the bottom plane of the lower electrode. Furthermore, a dielectric layer and the lower electrode can not be formed due to the short between the bumps.

FIGS. 5 (A) and (B) are schematic cross-sectional views of the lower electrode shown along an Y1" imaginary line and the X1 imaginary line shown in FIG. 4.

In short, FIGS. 5, (A) and (B) are cross-sectional views of the lower electrode shown along the major axis of the ellipse shape and the minor axis of the ellipse shape, respectively.

As already mentioned, the cylinder type capacitor has the quadrilateral and the ellipse shape. In addition, an aspect ratio of the major axis and the minor axis is extremely high because the etching process is carried out mainly along the minor axis.

The etching profiles for the major axis and the minor axis are not identical due to different etching properties which are very sensitive to the aspect ratio. Therefore, because of the etching properties of the sacrifice insulation layer, a vertical etching profile as indicated by a reference mark '45' in FIG. 5 (B) is obtained along the minor axis and the tapering etch profile as indicated by a reference mark '44' in FIG. 5 (A) is obtained along the major axis. Such tapering etch profile causes a decrease in the effective capacitance. In addition, the capacitance is further decreased because the bump can not be formed due to a short between bumps at the lower plane of the lower electrode as mentioned.

The other hand, an excessive etching process along the major axis may be carried out to obtain a vertical etch profile. In this case, the sacrifice insulation layer is over etched along the minor axis though. Consequently, a "bowing" profile is obtained by the excessive etching process mentioned above. Such a bowing profile also becomes another cause inducing the short between the lower electrodes as already shown in FIG. 3.

In addition, a possibility of the lower electrode being lifted during the dip-out process or other succeeding processes is increased by a reduced contact area of the lower electrode. Herein, the contact area is reduced by the tapering etch profile formed along the major axis. Furthermore, a thickness of the deposited lower electrode is decreased due to a narrow critical dimension and thereby, increasing a possibility of the lower electrode being eventually broken.

As size of semiconductor devices is decreased, an etching depth for securing a constant capacitance gets deeper and thereby, increasing the aspect ratio gradually. In addition, a difference between etching profiles formed along the major axis and the minor axis becomes more pronounced. Consequently, an effective capacitor area is reduced and it becomes difficult to secure the required capacitance. Furthermore, a possibility that an electrical short is generated by a bridging phenomenon is substantially increased.

SUMMARY OF THE DISCLOSURE

A semi-conductor device is disclosed that is capable of preventing a short of lower electrodes caused by a leaning or lifting phenomenon during processes for forming the lower electrodes and while still providing enough capacitance by widening an effective capacitor area. A method for fabricating the same is also disclosed.

A disclosed semiconductor device comprises a plurality of capacitor plugs disposed in an orderly separation distance, wherein midpoints of the capacitor plugs are located at inter-section points of X virtual axis and Y virtual axis which are vertical to the X virtual axis; and a plurality of lower electrodes used for a capacitor and disposed in an orderly separation distance to be respectively connected with the capacitor plugs, wherein midpoints of paired lower electrodes coupled along a Y virtual axis are respectively located at different positions deviated from the Y virtual axis in opposite direction along the different X virtual axis and an upper plane of the lower electrode features an octagonal or a circular shape.

BRIEF DESCRIPTION OF THE DRAWINGS

Other aspects of the disclosed devices and methods will become apparent from the following description of the preferred embodiments with reference to the accompanying drawings, wherein.

DETAILED DESCRIPTION OF THE PRESENTLY PREFERRED EMBODIMENTS

Hereinafter, semiconductor device is disclosed that is capable of preventing electrical shorts of lower electrodes caused by a leaning or lifting phenomenon during forming the lower electrodes and which provides enough capacitance by widening an effective capacitor area. Methods for fabricating the same will also be described in detail referring to the accompanying drawings.

Figure 1A:
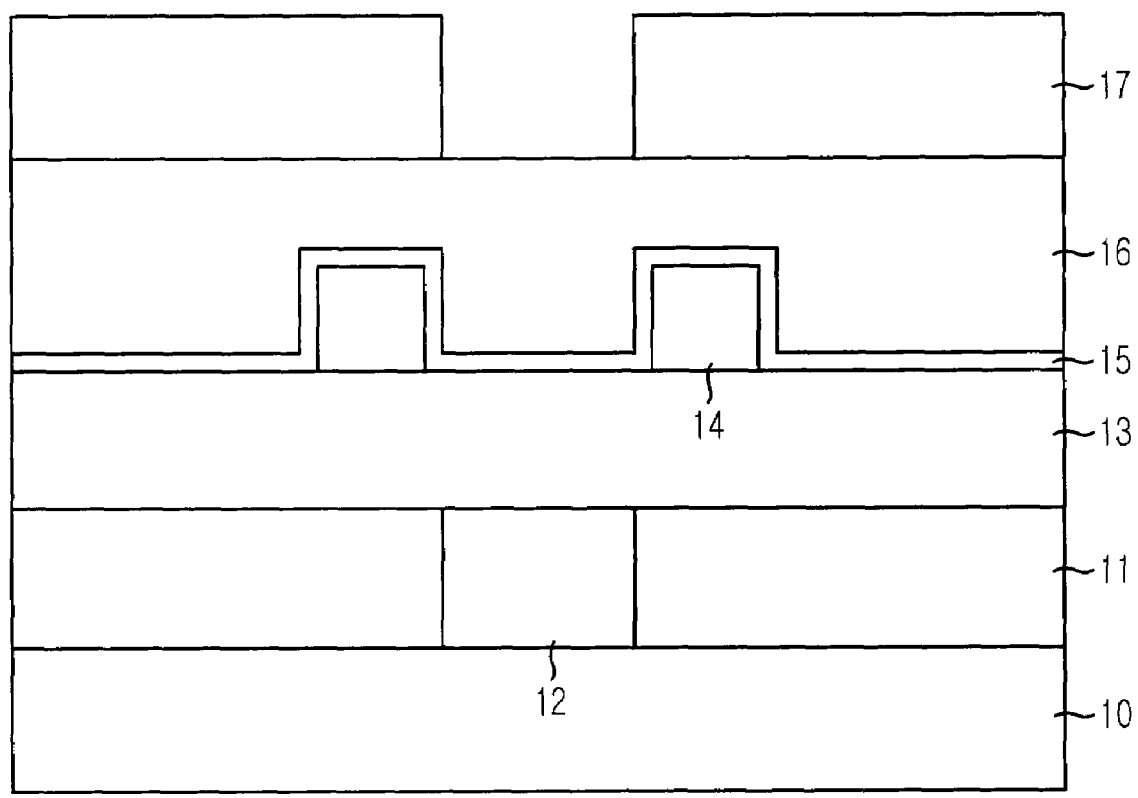
FIGS. 1A to 1C are cross-sectional views illustrating a process for forming a lower electrode of a conventional semiconductor device.
Figure 1B:
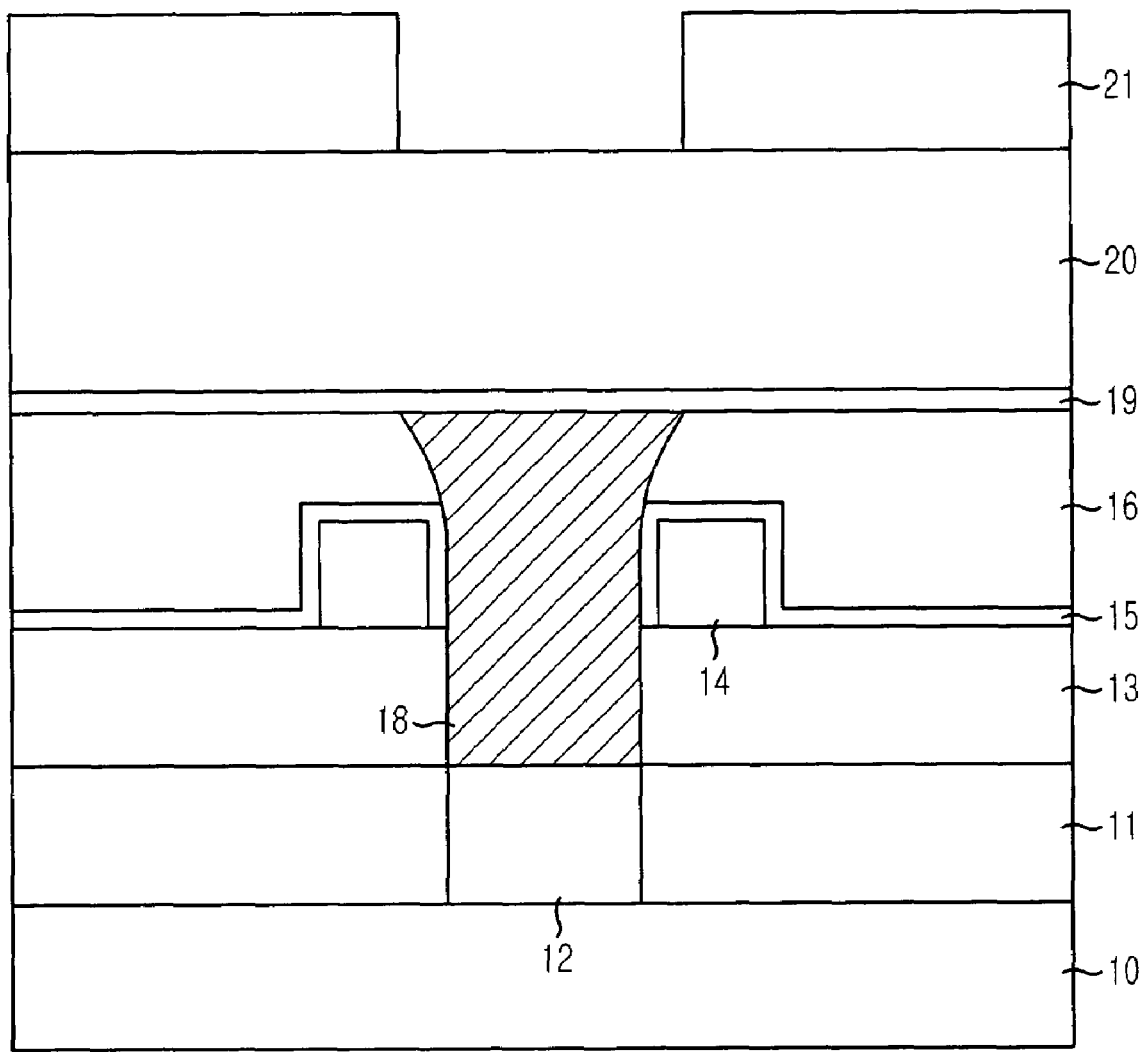
Figure 1C:
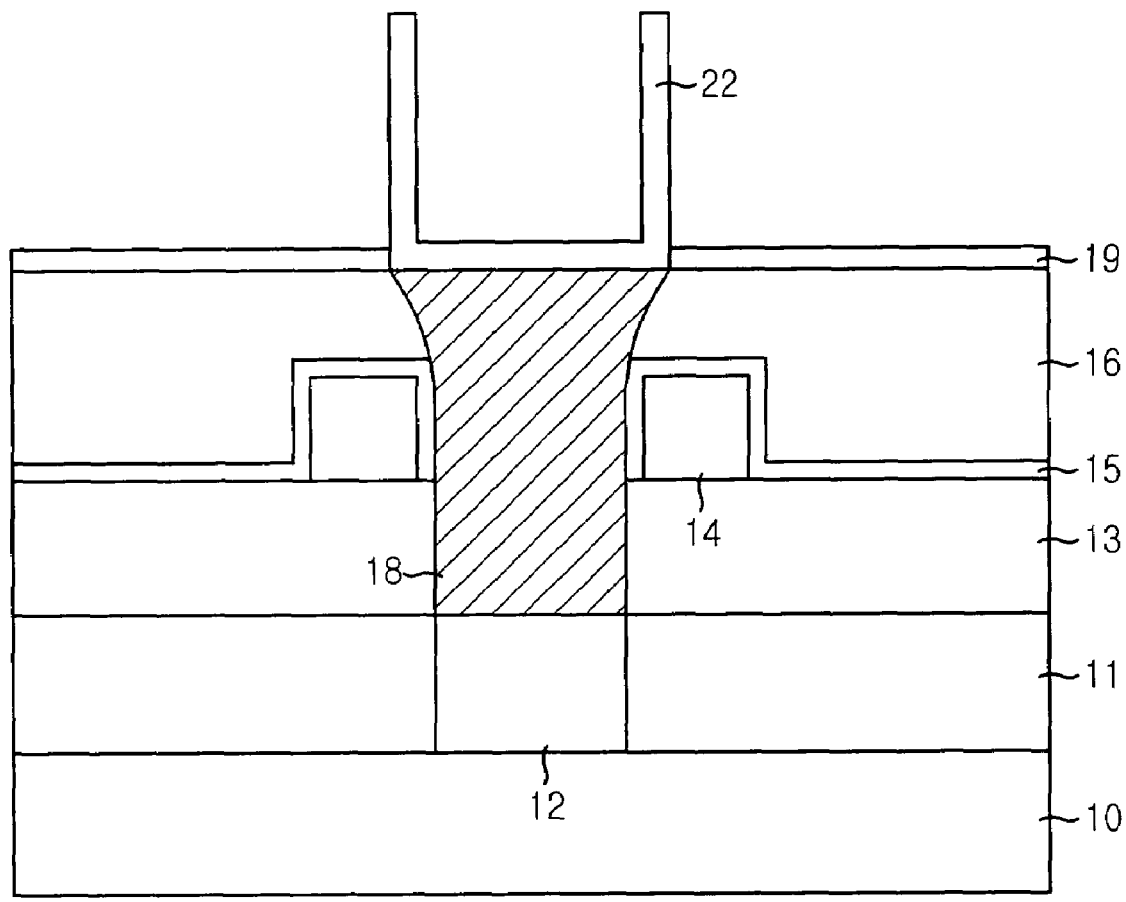
Figure 2:
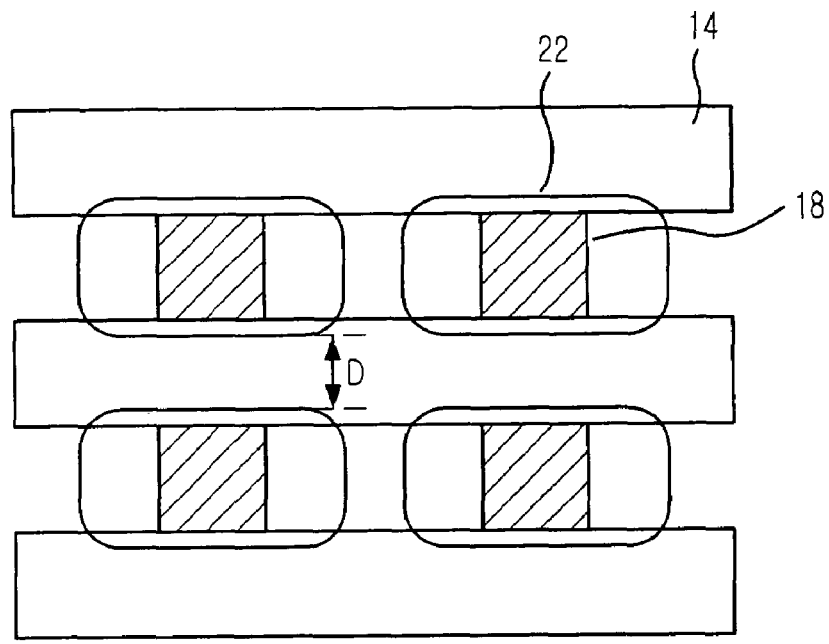
FIG. 2 shows a top view of a plurality of lower electrodes.
Figure 3:
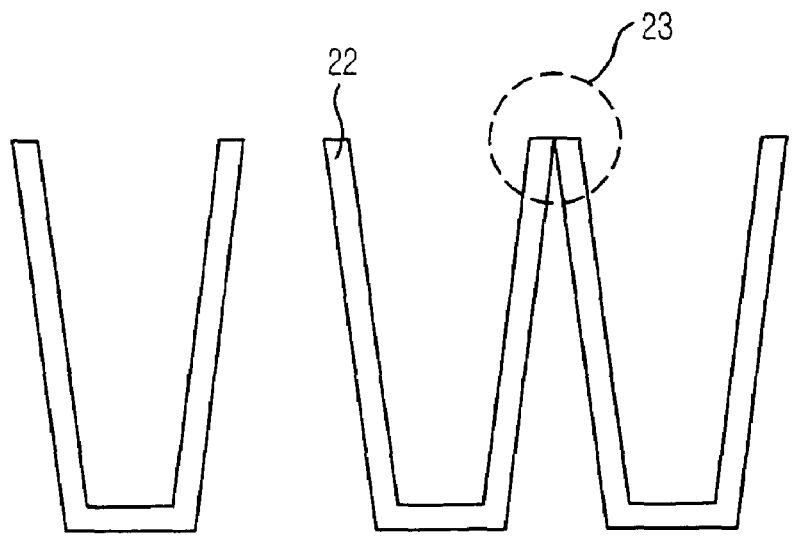
FIG. 3 is a schematic cross-sectional view illustrating an electrical short caused by a leaning phenomenon between lower electrodes.
Figure 4:
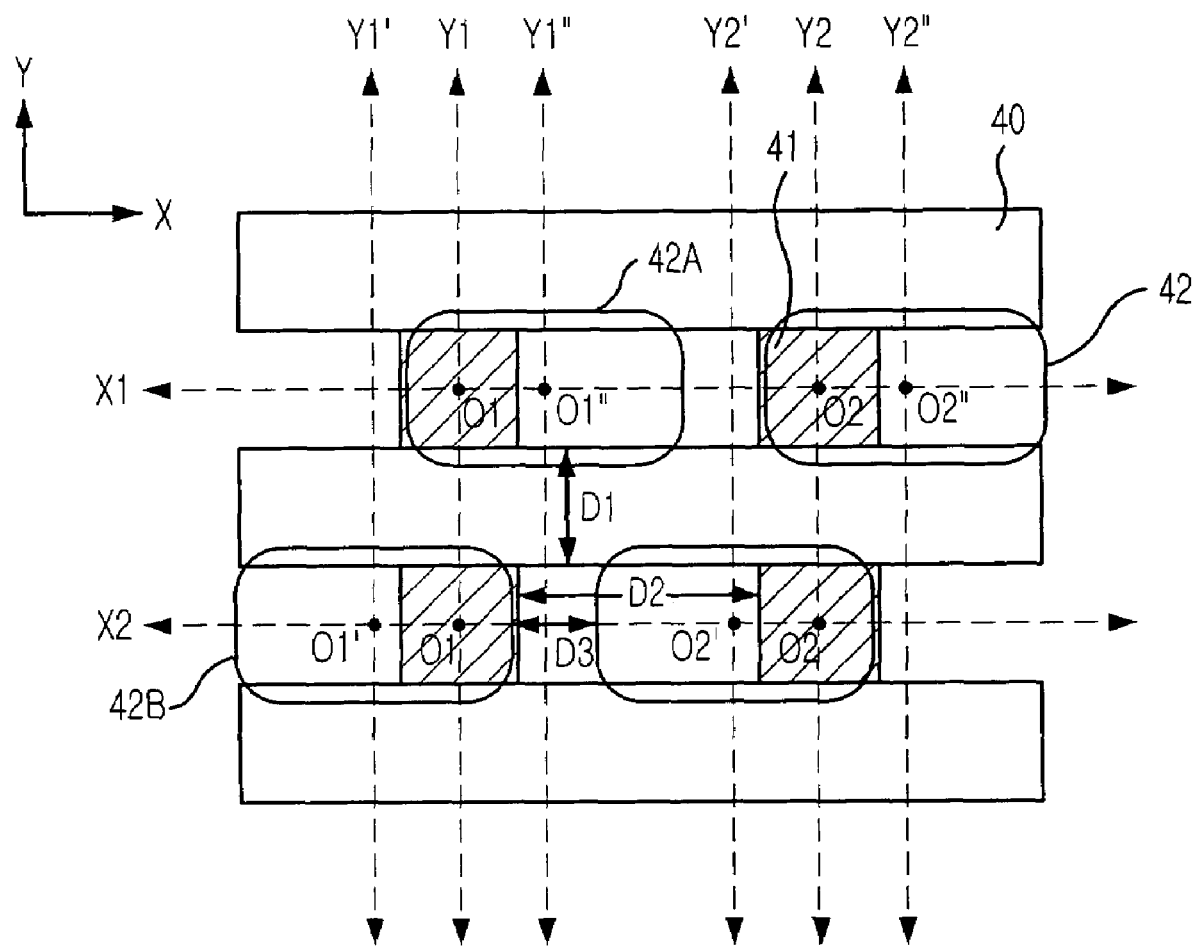
FIG. 4 is a top view showing a conventional semiconductor device including a plurality of lower electrodes with the prior art.
Figure 5:
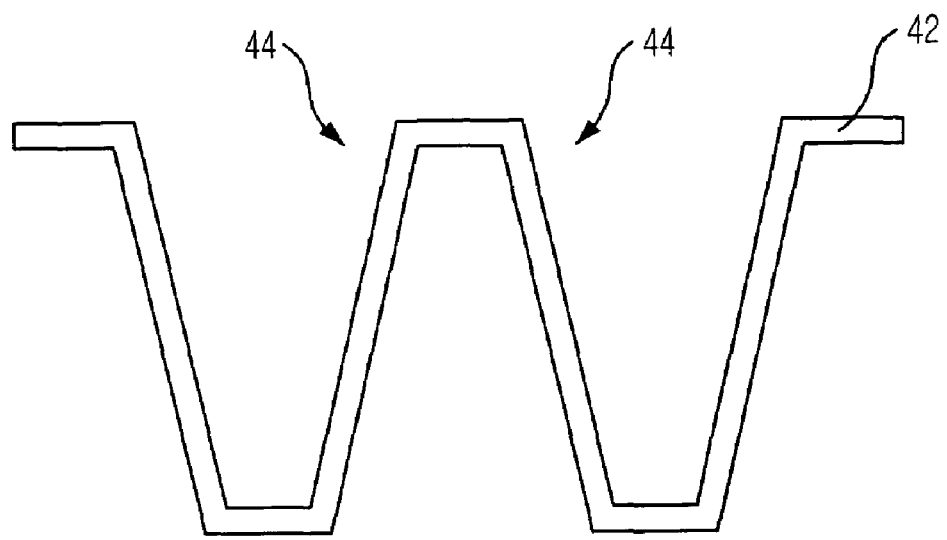
FIG. 5 is schematic cross-sectional views of a lower electrode shown along an Y1" imaginary line and an X1 imaginary line in FIG. 4, respectively.
Figure 5:
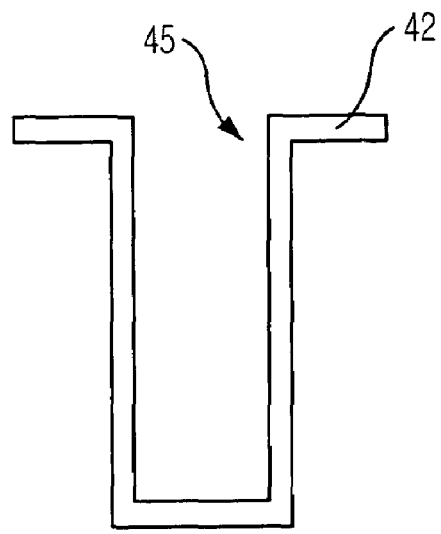
Figure 6:
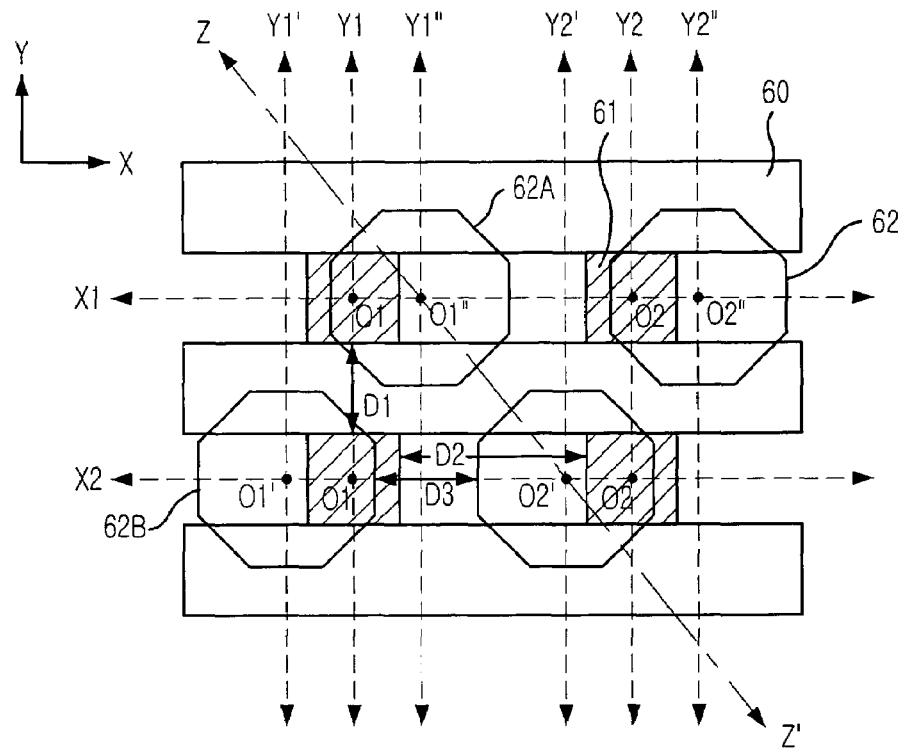
FIG. 6 is a schematic top view of a semiconductor device including a lower electrode formed in accordance with a first disclosed embodiment.
Figure 6:
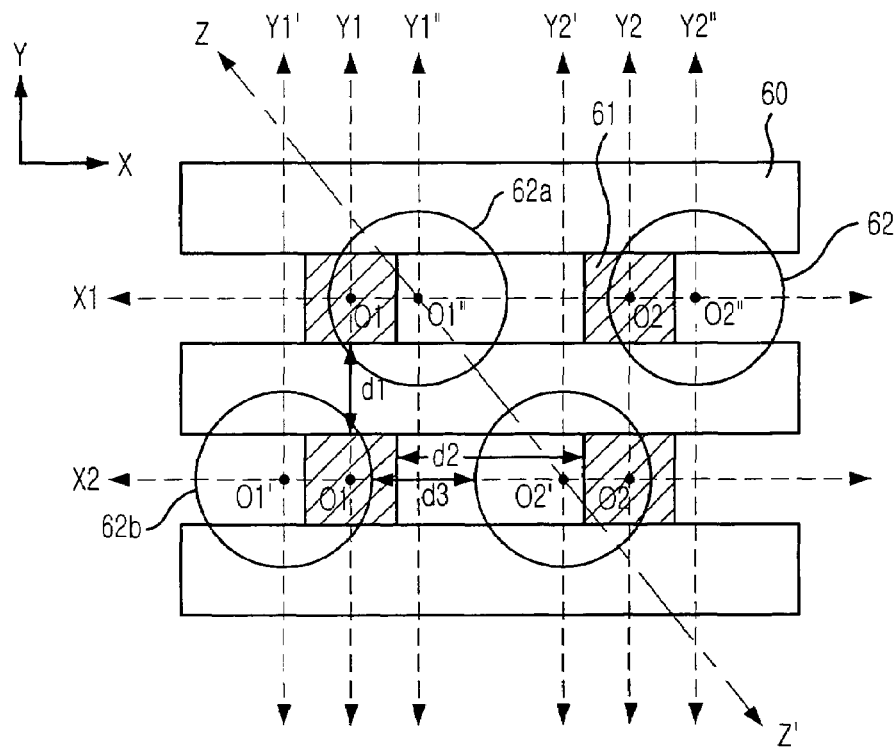

FIG. 6 is schematic top view showing semiconductor devices including a lower electrode formed in accordance with a first disclosed embodiment.

Referring to FIG. 6, a plurality of bit lines 60 are formed in an X direction. A plurality of X virtual axis (only X1 and X2 are illustrated in FIG. 6) having a direction identical to the X direction and a plurality of Y virtual axis (only Y1 and Y2 are illustrated in FIG. 6) vertical to the X virtual axis are illustrated in FIGS. 6A and 6B. Also, four more Y virtual axis Y1', Y1", Y2' and Y2" are illustrated in FIG. 6.

A matrix structure is formed with the X virtual axis and the Y virtual axis, and accordingly, a plurality of intersection points is formed. A plurality of capacitor plugs 61 is formed as interleaved between the bit lines. More particularly, the capacitor plugs are formed as a midpoint of the capacitor plug to be located at the inter-section point and in between bit lines.

In detail, the capacitor plug 61 is connected with a first plug which is in contact with an activation area, i.e., a source/drain region, of a semiconductor substrate. In addition, the capacitor plugs 61 neighboring along the X virtual axis are formed within a predetermined interval 'd2'. In view of the Y virtual axis, the capacitor plugs 61 are formed within a predetermined interval 'd1' which is identical to a width of the capacitor plug 61 or the bit line 60. For reference, the width of the capacitor plug 61 is identical to that of the bit line 60.

However, a distance between the neighboring capacitor plugs is smaller than the 'd1' and the 'd2' in reality because a landing plug structure is adopted for form the capacitor plug 61. Herein, describing the landing plug structure, an upper plane of the capacitor plug 61 is minimized to satisfy a technical progress toward a large-scale integration, and a lower plane of the capacitor plug 61 becomes wider than the upper plane.

Each of the upper planes of the capacitor plugs 61 is electrically connected with corresponding lower electrode 62 in one to one correspondence, and the lower electrodes 42 neighboring along the X virtual axis are formed in a predetermined interval 'd3'.

Herein, along a Y virtual axis selected at discretion, for example, Y1 which passes through a midpoint of the capacitor plug 61, a pair of lower electrodes 62A and 62B neighbors to each other, and the paired lower electrodes are located at different X virtual axis. Herein, the paired lower electrodes are formed to have an area that the lower electrodes 62 face each other in opposite direction are minimized or zero. That is, the paired lower electrodes are formed not to be overlapped to have overlapped in minimum, if the paired lower electrodes are on same X virtual axis. Therefore, the distance of two neighbored Y virtual axis has to be controlled in order to optimize an interval of the paired lower electrodes.

As shown in FIG. 6, both of midpoints of the capacitor plugs which are in contact with the lower planes of the lower electrodes 62A and 62B are located on one Y virtual axis (Y1). However, the midpoints (01', 01") of the lower electrodes are located on different Y virtual axis (Y1', Y1"), respectively.

In short, each of the paired lower electrodes 62A and 62B is formed on corresponding X virtual axis (X1, X2) and on different Y virtual axis not to be overlapped or to be overlapped in minimum, if the paired lower electrode is on same X virtual axis.

Thus, the lower electrodes 62 formed in a zigzag distribution are helpful for reducing the area that the lower electrodes face each other in opposite direction. In addition, an interfacial tension caused by a solution used for a wet dip-out process for removing a sacrifice insulation layer after forming the lower electrode 62 can be reduced. For reference, the sacrifice insulation layer is not illustrated. Consequently, an electrical short of the lower electrodes caused by the lifting phenomenon can be prevented.

In addition, if one of the paired lower electrodes 62 may be located at an area indicated by a reference mark 'd2', it is possible to make the area the paired lower electrodes facing each other in opposite direction disappear. In the case mentioned above, size of the lower electrode 62 can be increased and thereby, also increasing the capacitance of the capacitor.

Consequently, the lower electrodes deposited in the zig-zag distribution are helpful for preventing a bridge phenomenon. Furthermore, a more effective method for solving the bridge phenomenon generated between the lower electrodes can be suggested. The capacitor plugs themselves may be disposed in a zigzag distribution. In this case, the bridge phenomenon can be considerably reduced.

A reduction of the capacitance of the capacitor caused by different etching profiles of a major and a minor axis of the sacrifice insulation layer is avoided, and a bowing profile formation of the sacrifice insulation layer caused by an excessive etching process along the minor axis is also prevented. The budging phenomenon is also alleviated.

According to a first disclosed embodiment, upper planes of a plurality of lower electrodes 62 are formed to have an octagonal or circular shape. The major and minor axes of the upper plane can not be defined. Furthermore, although the octagonal or circular shape is non-symmetrical and there exist the major and minor axes, the aspect ratio, that is, the ratio of the major axis to the minor axis merely ranges from about 1 to 1 to about 2 to 1. Consequently, a trade-off problem of the capacitance reduction and the electrical short between the lower electrodes can be solved concurrently.

Herein, the lower electrode 62 having the aspect ratio of 1 to 1 is regarded as a most ideal case.

Figure 7:
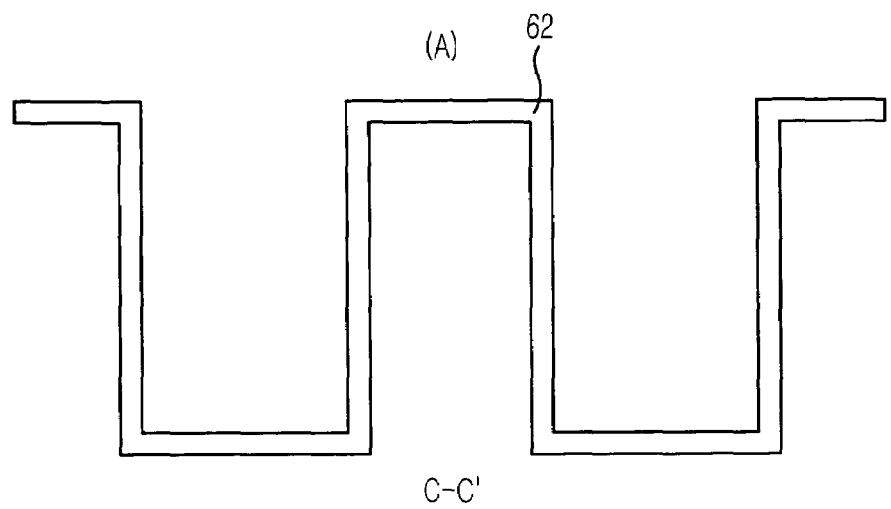
FIG. 7 is a cross-sectional view of a lower electrode shown along an X1 imaginary line, an Y1" imaginary line, and a Z-Z' line in FIG. 6.
Figure 7:
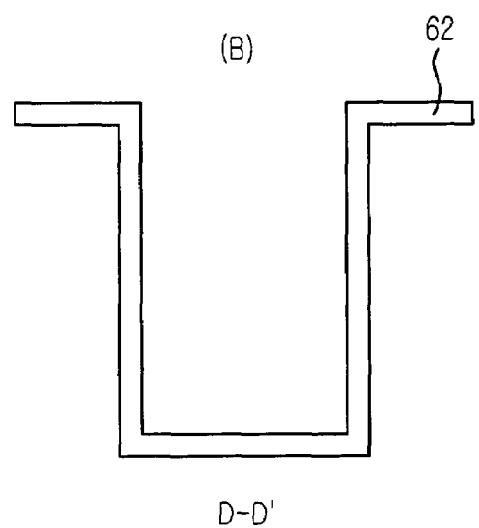
Figure 7:
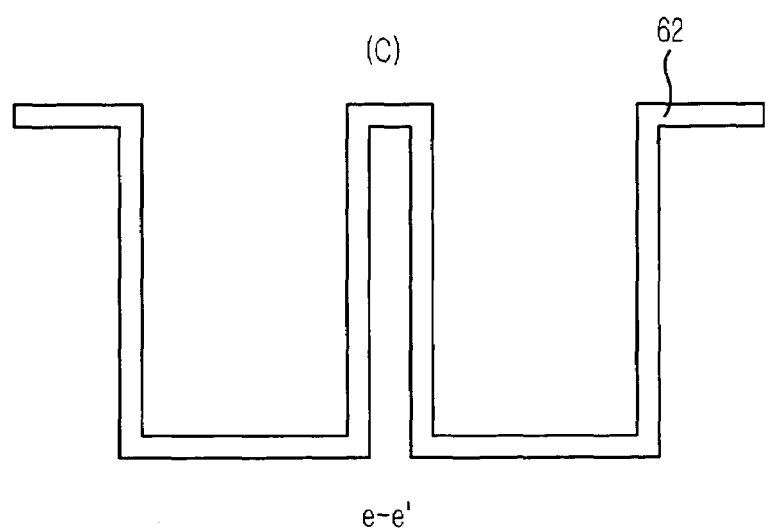

FIGS. 7 (A) (B) (C) are schematic cross-sectional views of the lower electrode 62 respectively shown along an X1 imaginary line, an Y1" imaginary line and a Z-Z' imaginary line shown in FIG. 6. When the lower electrodes 62 having octagonal or circular cylinder structure are applied to the semiconductor device, the capacitance of the capacitor can be improved and the bowing phenomenon of the sacrifice insulation layer caused by an excessive etching process is prevented because the aspect ratio of the major and minor axes of the lower electrodes 62 having the octagonal or circular cylinder structure is about 1 to 1.

In addition, the area that the paired lower electrodes face each other in opposite direction can be reduced by disposing the lower electrode 62 in the zigzag distribution. Herein, the lower electrode is located at an area corresponding to between the bit lines. Consequently, the bridge phenomenon of the lower electrodes caused by the interfacial tension of a wet etching solution can be prevented, wherein the wet etching solution is used for removing a remnant sacrifice insulation layer by carrying out a wet dip-out process. In addition, an area occupied by the lower electrode 62 can be much more increased by disposing the paired low electrodes in the zigzag distribution and thereby, increasing the capacitance of the capacitor.

Furthermore, as a difference of the etching profiles along the major axis and the minor axis becomes considerably smaller, an upper plane area of the lower electrode 62 and a lower plane area of the lower electrode 62 become practically same after carrying out a chemical mechanical polishing (CMP) process for planerizing a surface of the semiconductor device which has gone through predetermined processes. Eventually, the lower electrode with the octagonal or circular cylinder structure is formed. At this time, a lateral plane of the lower electrode is vertical to both of the upper plane and the lower plane.

Figure 8:
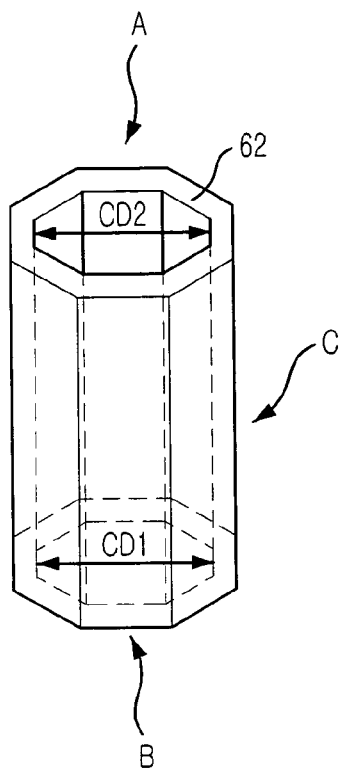
FIG. 8 is a perspective views of lower electrodes having an octagonal or a circular cylinder structure.
Figure 8:
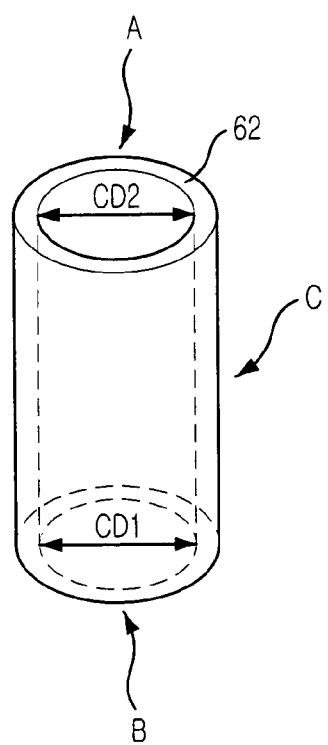

FIG. 8 is a perspective view of the lower electrodes with a three-dimensional octagonal or circular cylinder structure. Referring to FIG. 8, it is shown that the upper plane A area is practically identical to the lower plane B area, and the lateral plane C is vertical to both of the upper plane A and the lower plane B.

Therefore, a critical dimension 'CD1' of the lower plane B of the lower electrode 62 is practically identical to another critical dimension 'CD2' of the upper plane A of the lower electrode 62 and thereafter, a meta-stable poly silicon (MPS) layer can be grown on the electrode layer 62, and a dielectric layer can be grown on the MPS layer after forming the MPS layer, successively. In addition, an increased volume of the lower electrode with the octagonal or circular cylinder structure increases the capacitance of the capacitor as well.

Furthermore, it is possible to form the lower electrode 62 with considerably thick thickness, and a contact area of the lower plane is also increased.

The lower electrode can be formed by using the capacitor plug layout identical to that in accordance with the prior art without performing additional processes any more.

Figure 9:
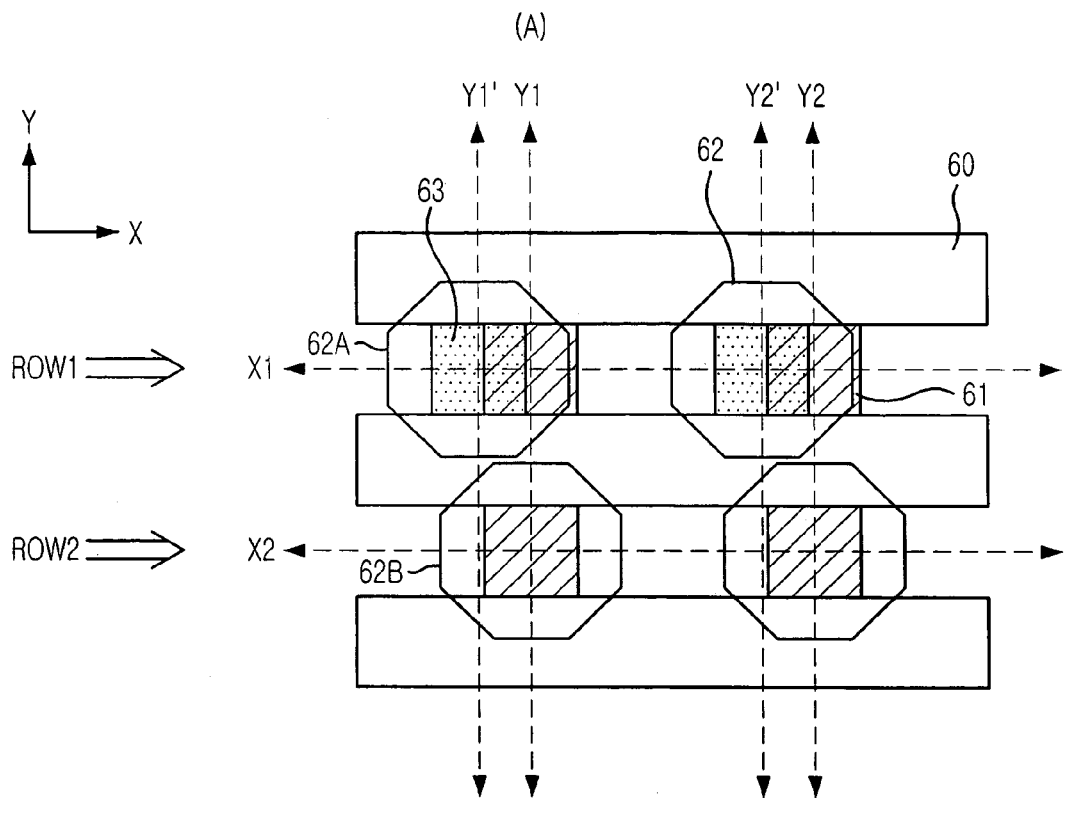
FIG. 9 is a schematic cross-sectional view of a semiconductor device including lower electrodes in accordance with a second disclosed embodiment.
Figure 9:
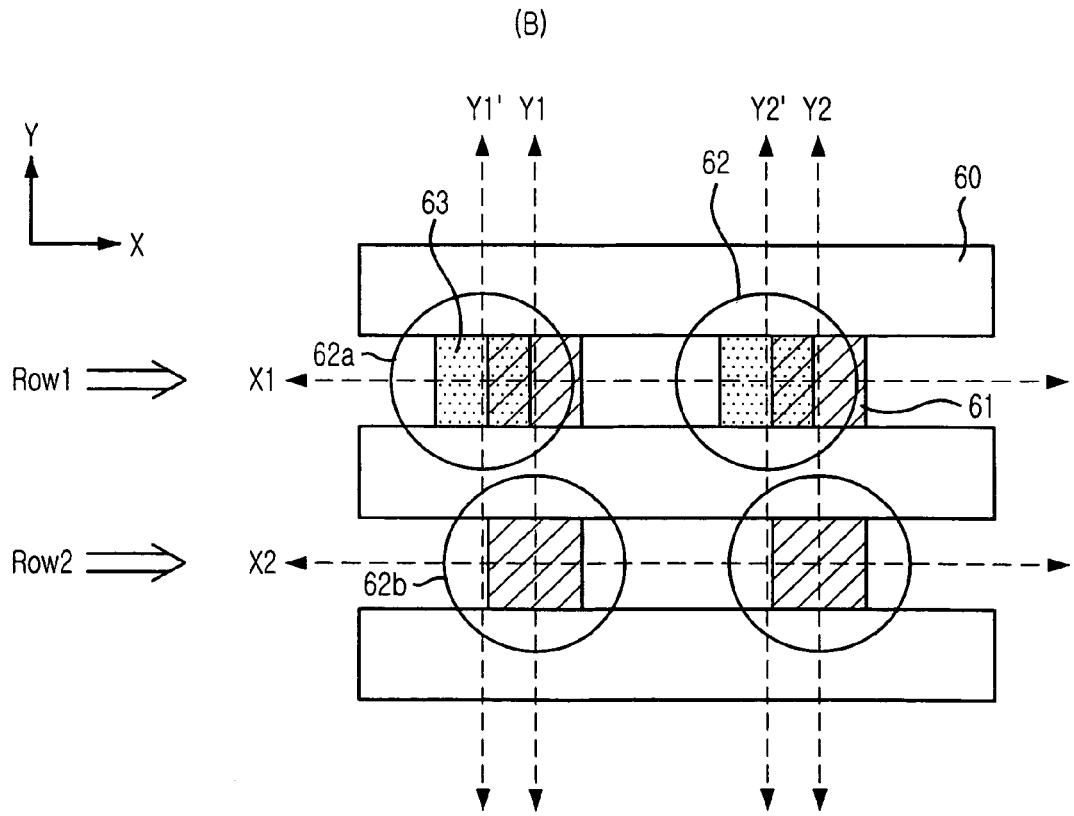

FIG. 9 shows schematic cross-sectional views of the semiconductor device including the lower electrode in accordance with the second disclosed embodiment.

Referring to FIG. 9, a plurality of bit lines are formed in the direction of the X virtual axis, and the capacitor plugs 61 are respectively disposed between the bit lines. Herein, a whole layout of the disposed lower electrodes 62 shows a same matrix distribution as already described in FIG. 6.

However, according to the second embodiment, a plurality of contact pads 63 are used to connect the lower electrode 62 with the capacitor plug 61 electrically. To form the contact pad, an extra process is required. However, if the contact pad 63 is applied to the semiconductor device, a contact area of the contact pad 63 is increased. However, the area that the lower electrodes 62 face each other in opposite direction are minimized or even become zero. Herein, the lower electrodes 62, for example, the paired lower electrodes 62A and 62B are located at both sides of the bit line 60.

As shown in FIG. 9, only along the X virtual axis indicated with a reference mark 'ROW1' the contact pads 63 are formed. Also, the midpoint of the contact pad 63 is located at the X virtual axis X1 and the Y virtual axis Y1'. In short, in view of the Y virtual axis, the contact pad 63 is shifted from the Y virtual axis Y1 to the Y virtual axis Y1". Above-described structural feature is applied to whole layout of the contact pads 63 distribution.

In addition, as described in the first embodiment, the lower electrodes 62 are formed in the zigzag distribution and thereby, decreasing the area that the paired lower electrodes face each other.

Consequently, the lifting phenomenon of the lower electrode 62 and the electrical short between the lower electrodes 62 can be considerably reduced or prevented. Also, the pattern collapse phenomenon is prevented by the octagonal or circular shape of the upper plane of the lower electrode 62 and thereby, increasing the capacitance of the capacitor.

In addition, a contact resistance is also decreased by widening an area of which the contact pad is applied to make the capacitor plug 61 be in contact with the lower electrode 62.

Figure 10:
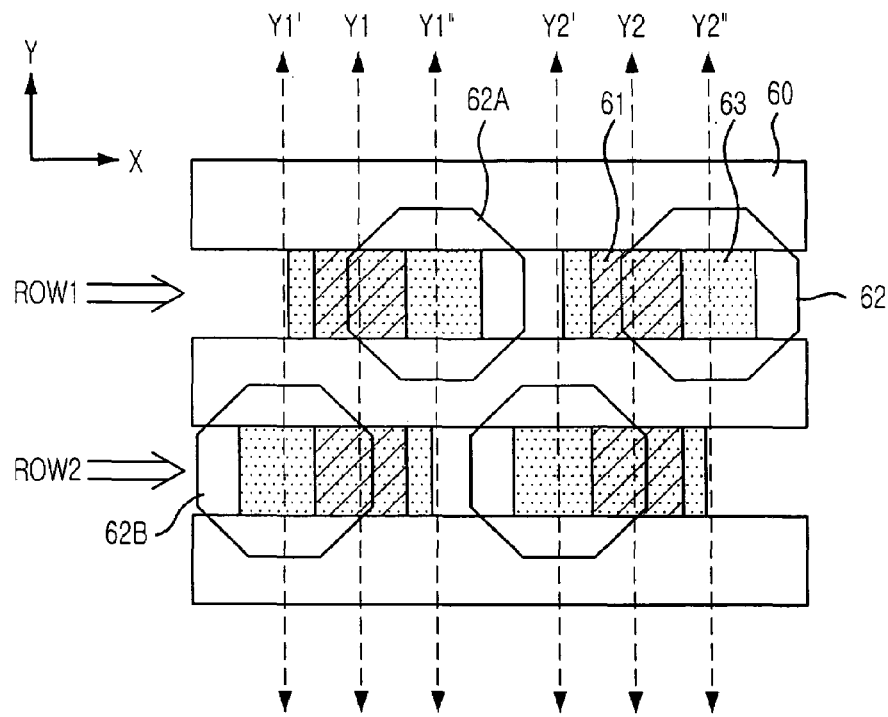
FIGS. 10 to 12 are schematic top views illustrating semiconductor devices including lower electrodes formed in accordance with respectively different arrangements.
Figure 10:
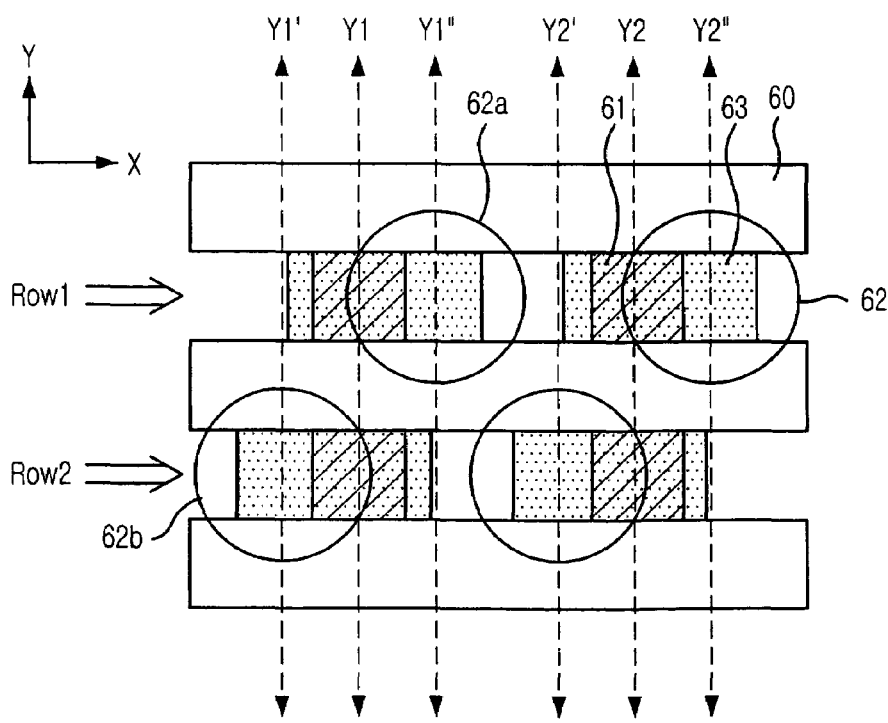
Figure 11:
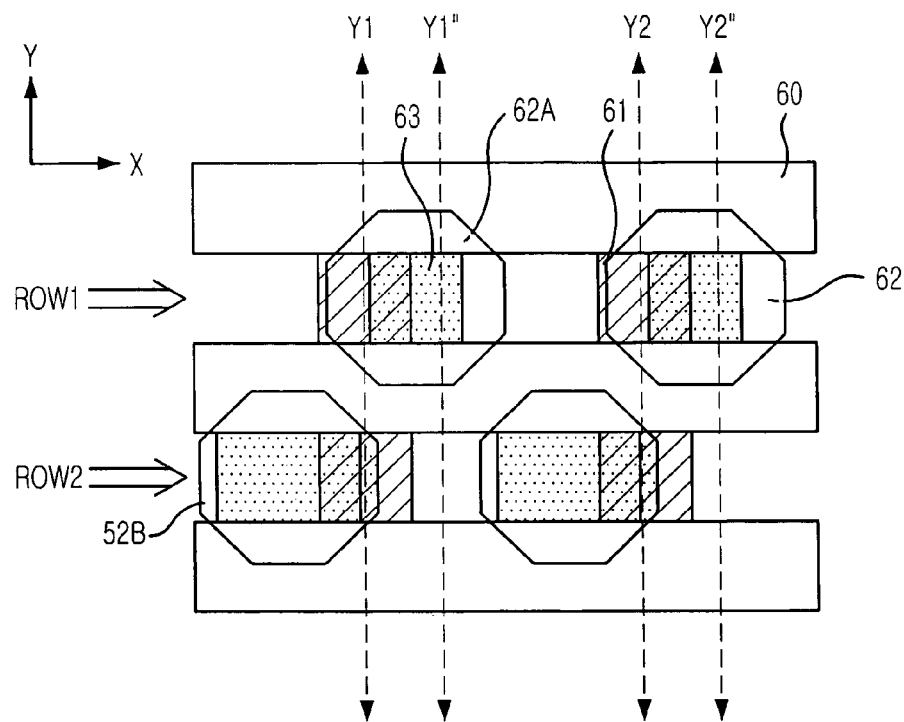
Figure 11:
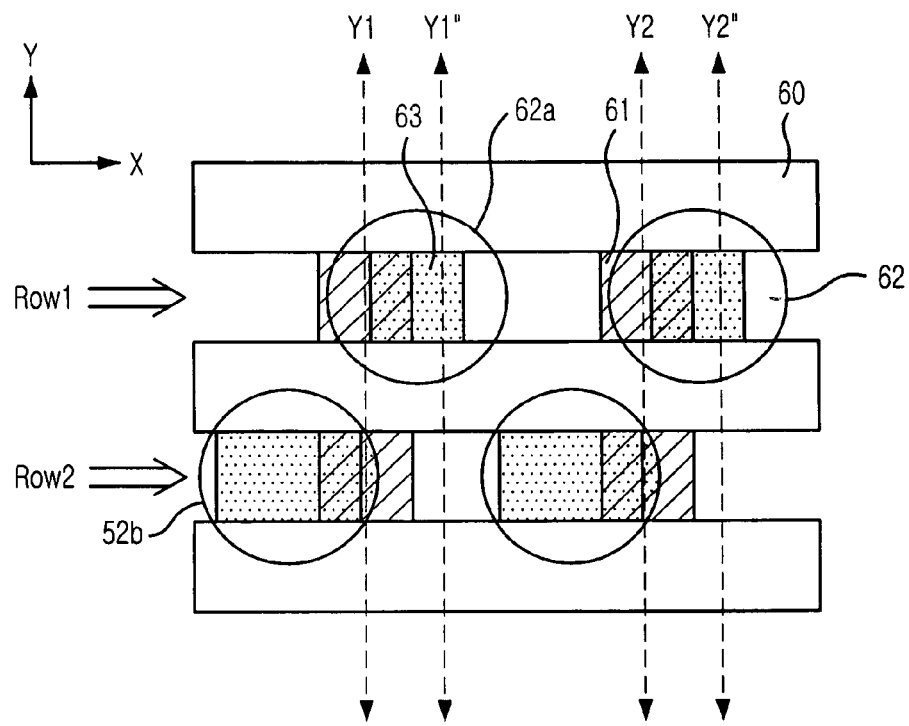

In FIGS. 10 and 11, the contact pads 63 are formed along all X virtual axis.

Figure 12:
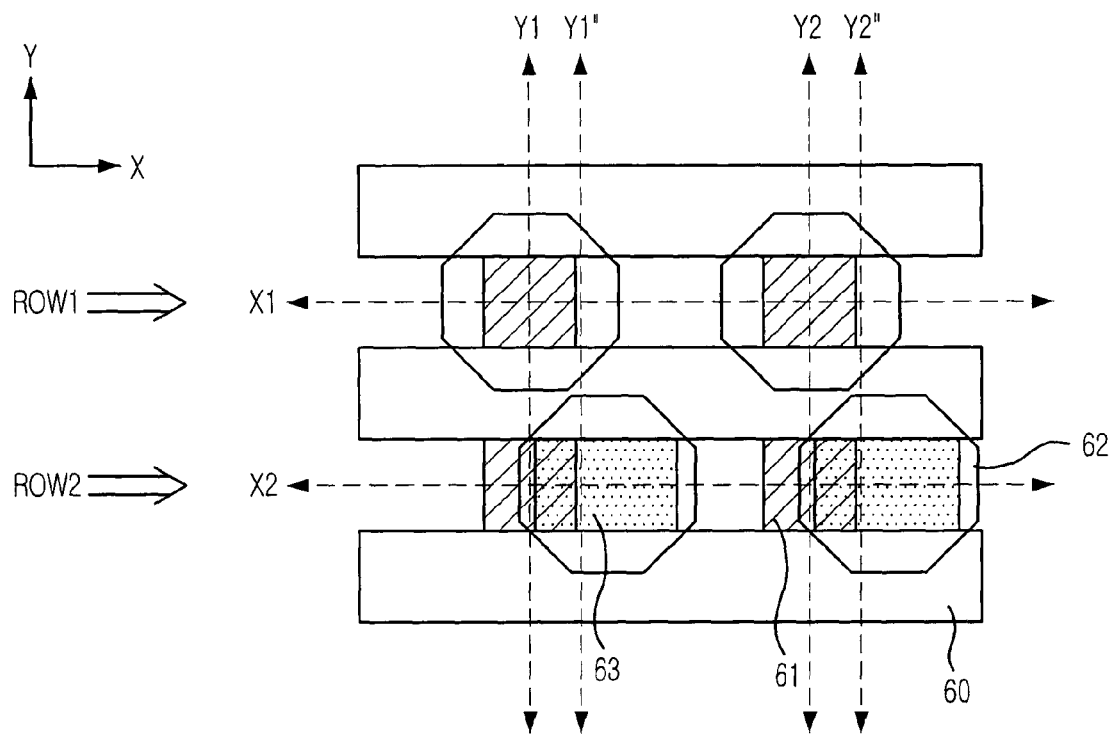
Figure 12:
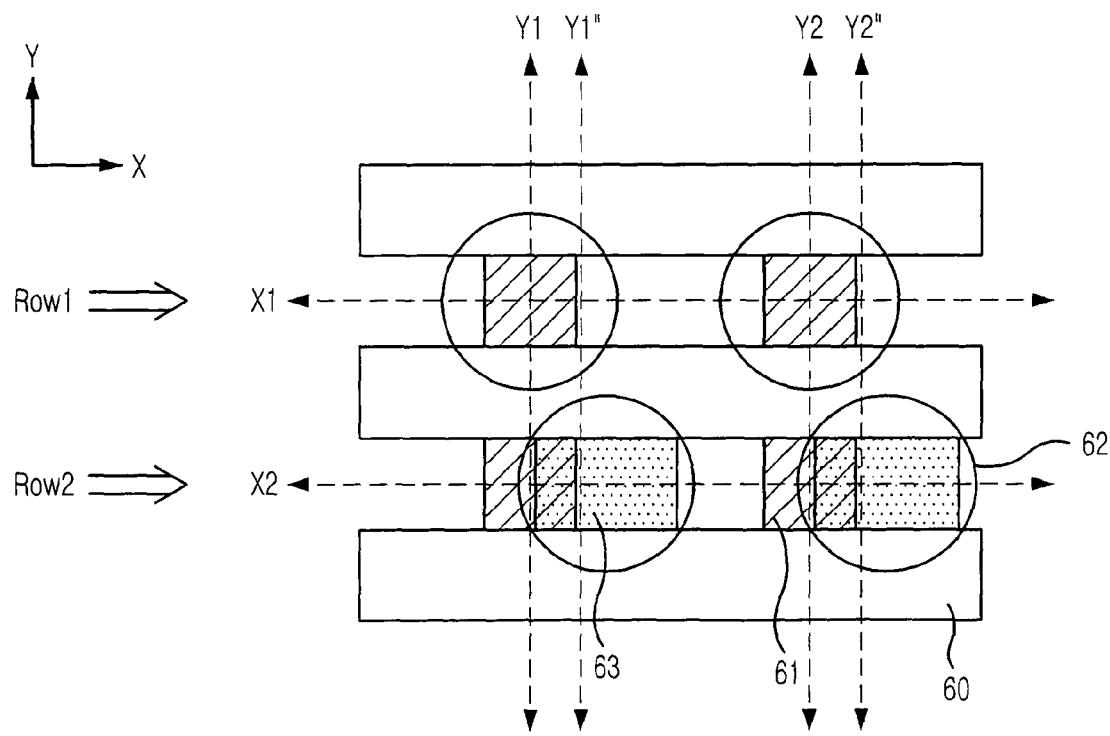

In FIG. 12, the contact pads are formed only along the X virtual axis corresponding to a line indicated with the reference mark 'ROW2'.

Referring to FIG. 12, the contact pads 63 are formed along the X imaginary line indicated with the reference mark 'ROW2', that is, the X2 axis imaginary line. The midpoint of the contact pad 63 is shifted in a right direction.

In view of a process margin, the contact pad 63 is much more advantageous than the capacitor plug 61. As a result, the contact pads 63 with sufficiently large size can be easily applied to a semiconductor device fabrication.

Referring to FIG. 10, the contact pads 63 are formed along all of the X virtual axis, and upper plane size of the contact pad 63 is larger than that of the capacitor plug 61.

Also, a contact area between the lower electrode 62 and the contact pad 63 is increased, and another contact area between the lower electrode 62 and the capacitor plug 61 is also increased. Consequently, an over-lap margin and the contact resistance are decreased.

Referring to FIG. 11, the contact pads 63 are disposed along all X virtual axis. Furthermore, the contact pads 63 are disposed in the zigzag distribution wherein the zigzag distribution has been already described to explain the distribution of the lower electrodes 62 as shown in FIG. 6.

Also, in FIG. 10 and 11, the areas that the paired lower electrodes, for example, 62A and 62B, face each other in opposite direction are minimized.

Below, it will be explained that problems caused by the wet dip-out process for the sacrifice insulation layer can be overcome through the first and second embodiments.

Figure 13:
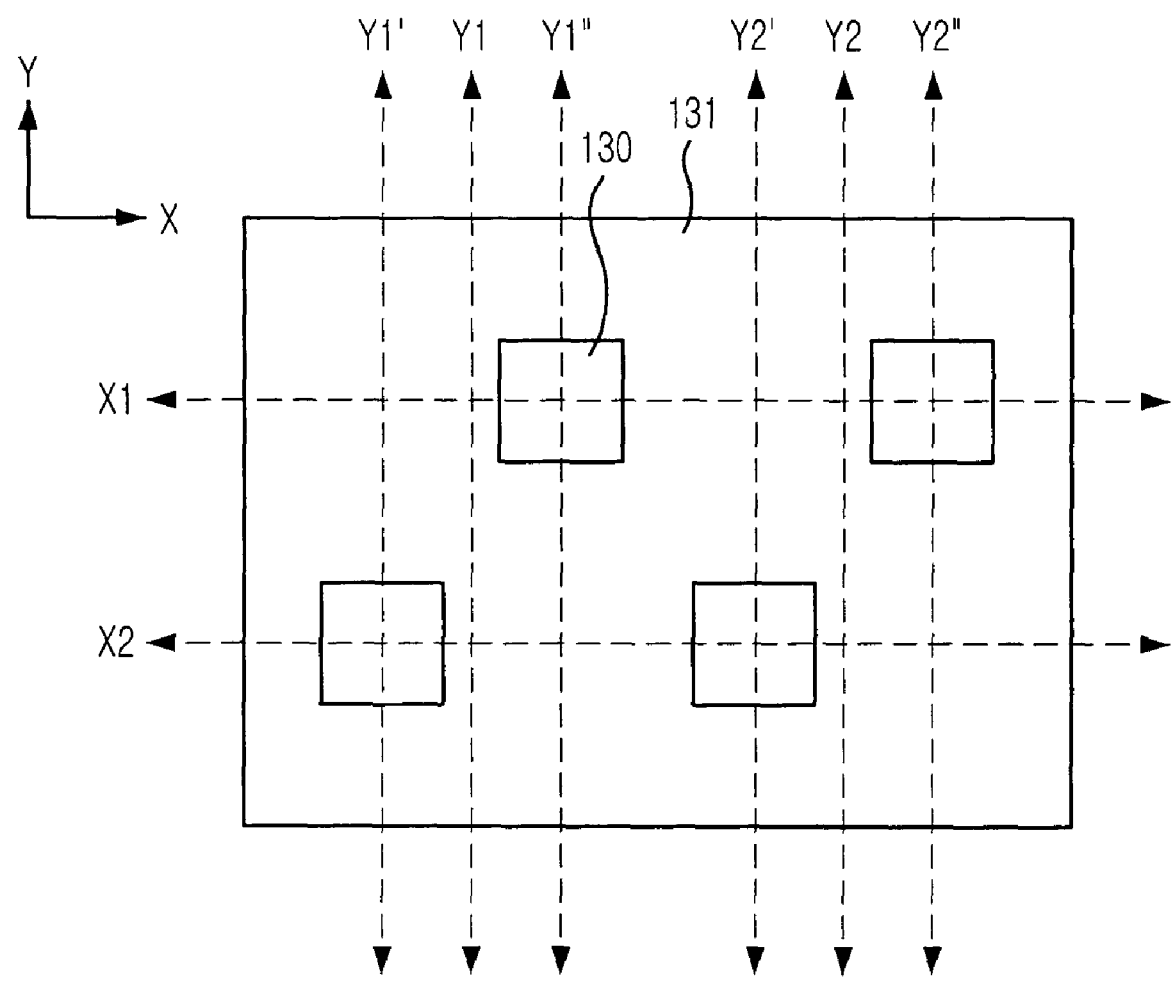
FIG. 13 is a top view showing an example of a disclosed mask pattern.

Specifically, FIG. 13 is a top view showing an example for a mask pattern. Describing the first embodiment shown in FIG. 6, the area that the paired lower electrodes face each other opposite direction is minimized or become zero by locating the midpoints of the paired lower electrodes 62 in the zigzag distribution along the X virtual axis. In FIG. 13, an open part 130 of the mask pattern is used to form the paired lower electrodes. In short, the mask pattern capable of realizing the above-mentioned distribution of the paired lower electrodes corresponding to the open part of the mask pattern is shown in FIG. 13. The specific process for forming the lower electrodes by using the mask pattern will now be described.

FIG. 13 shows the electrode mask pattern for forming the distribution of the lower electrodes shown in FIGS. 6A and 6B.

Midpoints of the open parts are located at Y1' imaginary line and the Y" imaginary line as shown in FIG. 13. Consequently, an area that the open parts 130 face each other in opposite direction becomes zero. Herein a reference mark 131 indicates an area not being opened, that is, a remnant sacrifice insulation layer area.

The open part of the mask pattern has a quadrilateral shape. However, the lower electrodes in accordance with the first embodiment and the second embodiment have the octagonal or circular shape. Such phenomenon is caused by a characteristic etching mechanism occurring around a corner area of the quadrilateral shape while performing an etching process.

Furthermore, to obtain the upper planes of the lower electrodes with the octagonal or circular shape, a mask pattern with the open part with a square shape is preferred over a mask pattern with the open part having a rectangular shape.

Also, a mask pattern comprising the open part featured by the octagonal shape is used to obtain the octagonal or circular shapes.

FIGS. 14A to 14D are cross-sectional views showing fabrication processes for the semiconductor device with a contact pad.

A first insulation layer 141 comprising an oxide based layer is formed over a substrate comprising various elements for fabricating the semiconductor device such as a transistor. Next, the first insulation layer 141 is penetrated to form a first plug 142. At this time, the 1st plug 142 is electrically connected to an impurity diffusion area such as source/drain area formed the substrate 140.

Herein, a TEOS layer is used for the for insulation layer 141. The first plug 142 is poly-silicon. A barrier layer with a structure such as Ti/TiSi2/TiN or Ti/TiN is formed over the first plug 142 in order to prevent a diffusion of an ohmic contact and a lower electrode material into the substrate even if not illustrated.

A planerization process such as a chemical mechanical process (CMP) is carried out to planerize the first plug 142 and the first insulation layer 141 and thereafter, forming a second insulation layer over the planerized structure.

Next, a bit line 144 is formed over the second insulation layer 143. At this time, the bit line is not over-lapped with the first plug 142. A first etch stop layer 145 constituted with a nitride based layer is thinly formed along an entire profile comprising the bit line 144.

The first etch stop layer 145 is used to prevent loss of the bit line 144 during an etching process for forming a lower electrode contact. Especially, a nitride based layer such as a silicon nitride layer or silicon oxide nitride layer is used to obtain an etching selectivity of a third insulation layer 146 constituted with an oxide based layer.

The third insulation layer 146 constituted with an oxide based layer is thickly formed over the first etch stop layer 145 and an upper plane of the substrate which has gone through the predetermined processes is planerized by performing a blanket etching process or the CMP process.

Continuously, the third insulation layer 146, the 1st etch stop layer 145, and the second insulation layer 143 are sequentially etched by using a photo-resist pattern 147 and thereafter, forming a contact hole which exposes the first plug 142 even if not illustrated.

At this time, a first etch stop is required prior to etching the first etch stop layer 145 and thereafter, the first etch stop layer 145 and the second insulation layer 143 are etched again. Eventually, the etching profile having the vertical structure is obtained.

Continuously, a conductive material such as poly-silicon is deposited on the entire surface of the substrate which has gone through the predetermined processes in order to bury the contact hole, and another CMP process is performed to planerize the substrate. Herein, the second plug 148 may be regarded as a main capacitor plug because the lower electrode of the capacitor and the first plug 142 are electrically connected by the second plug 148.

As a next step, a second etch stop layer 149 constituted with a nitride based layer is formed to prevent an attack to the second plug 148 during a succeeding etching process for forming the contact pad. However, it is possible to skip the process for forming the second etch stop layer because succeeding etching processes for forming the lower electrode of the capacitor lower electrode can be easily controlled.

Next, a fourth insulation layer constituted with an oxide based layer is formed over the second etch stop layer 149. At this time, an upper plane of the fourth insulation layer 150 becomes planerized because an oxide layer having excellent flatness is used or an extra planerization process is carried out.

Continuously, a mask pattern 151 used to form the contact pad is formed over the fourth insulation layer 150.

At this time, as suggested by the first and second embodiments, the mask pattern 151 includes the paired open parts that are adjacent to each other and located along the Y virtual axis. In addition, the area that the open parts 130 face each other in opposite direction is minimized or becomes zero. In short, the open parts 130 are disposed in the zigzag distribution in view of entire layout. At this time, the area that the open parts face each other in opposite direction corresponds to the paired portions of the sacrifice insulation layers formed by using the mask pattern 151 comprising the paired open parts 130.

In addition, at least one of the paired open parts 130, more specifically, the midpoint of at least one of the paired open parts 130 is located at a position deviated from the Y virtual axis along the X virtual axis, or the midpoints of the open parts are respectively located at different positions deviated from the Y virtual axis in opposite direction along the X virtual axis.

FIGS. 14A to 14D show a procedure for fabricating the semiconductor device as an example explaining a fact that size of the contact pad 152 is larger than that of the capacitor plug 148.

The open part which is not illustrated is formed by etching the fourth insulation layer 150 and the etch stop layer 149. At this time, the mask pattern 151 is used as an etching mask. Next, a material used for forming the contact pad 151 used to connect the capacitor plug 148 with the lower electrode electrically is formed and thereafter, carrying out the CMP process to planerize the contact pad 152. In addition, a third etch stop layer 153 constituted with a nitride based layer is formed over the contact pad 152 for the purpose of preventing loss of the contact pad 152 caused by the etching process of the sacrifice insulation layer for forming the lower electrode.

Figure 14A:
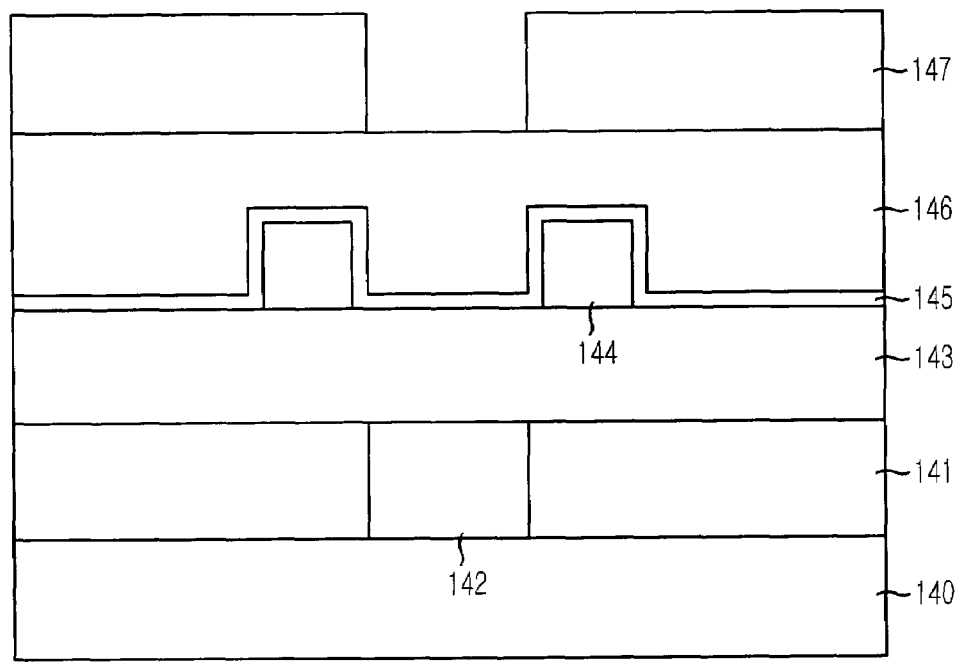
FIGS. 14A to 14D are cross-sectional views showing processes for fabricating a semiconductor device using a contact pad in accordance with another disclosed embodiment.
Figure 14B:
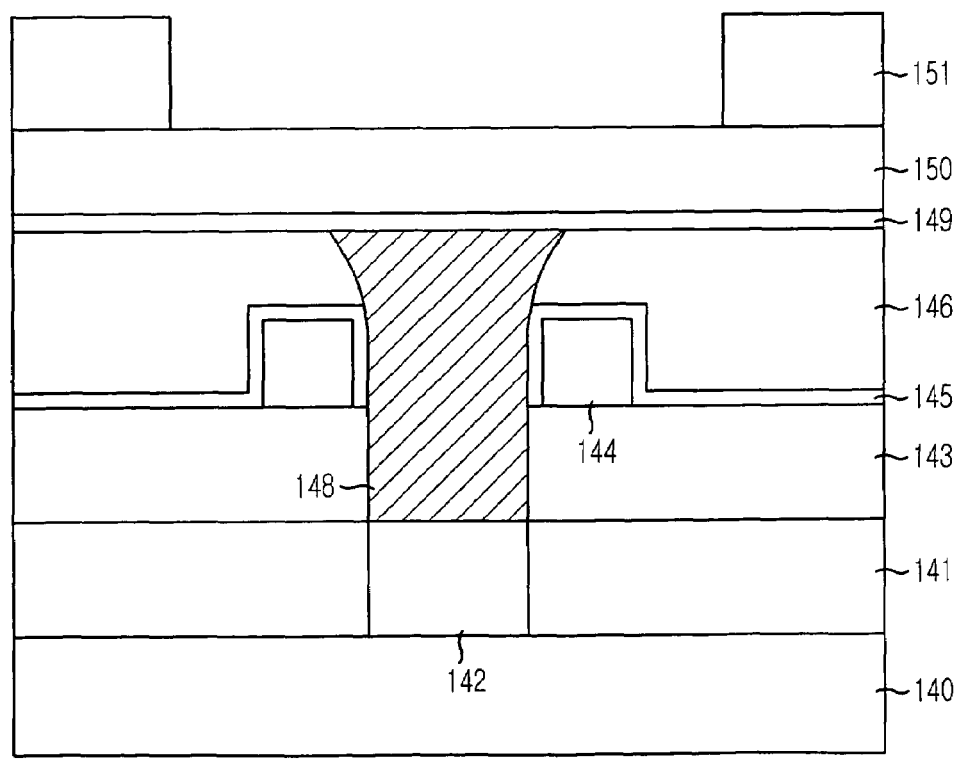
Figure 14C:
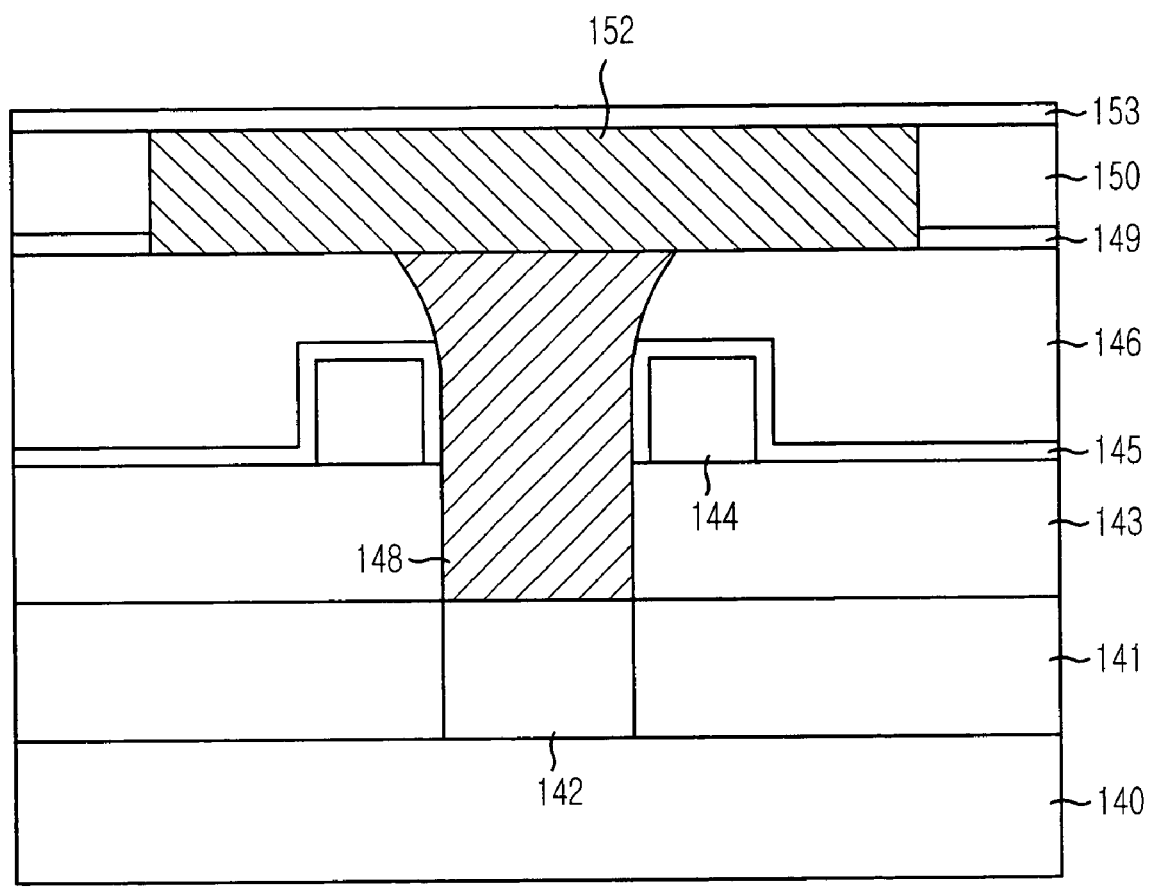

FIG. 14C is a cross-sectional view showing the third etch stop layer 153 formed on the contact pad 152.

Herein, it is possible for the contact pad 152 to have plane structures showing a variety of shapes such as an octagonal shape, a circular shape, an ellipse shape, a quadrilateral shape, triangular shape and so on.

Instead of depositing the material used for forming the contact pad 152 and planerizing it after forming the fourth insulation layer 150 and pattering it as already mentioned, the material for forming the contact pad 152 may be deposited over the second plug 148 directly and patterned to form the contact pad 152.

The sacrifice insulation layer is an oxide layer affecting the capacitance and is formed considering a vertical height of the capacitor on the third etch stop layer 153. Herein, the sacrifice insulation layer is not illustrated. Next, the mask pattern for forming the lower electrode is formed, wherein the mask pattern is not illustrated.

At this time, the midpoint of the lower electrode is not located exactly at the midpoint of the capacitor plug 148, and the photo-resist pattern should be appropriately controlled so as to maximize an area where the lower electrode and the contact pad are in contact with each other.

The sacrifice insulation layer is etched by using the mask pattern. At this time, the etching process is held back by the third etch stop layer 153 once, and thereafter removing the third stop layer in order to form the open part exposing a surface of the contact pad 152.

After removing the mask pattern, a conductive layer used for the capacitor lower electrode is deposited to be connected with the contact pad 152 along a profile obtained by the sacrifice insulation layer being etched and opened, that is, an entire profile comprising the open part. Next, the photo-resist is deposited enough to bury the formed conductive layer comprising a concave structure, and the conductive layer is planerized and isolated by carrying out the blanket etching process or CMP process until the surface of the sacrifice insulation layer is exposed.

Figure 14D:
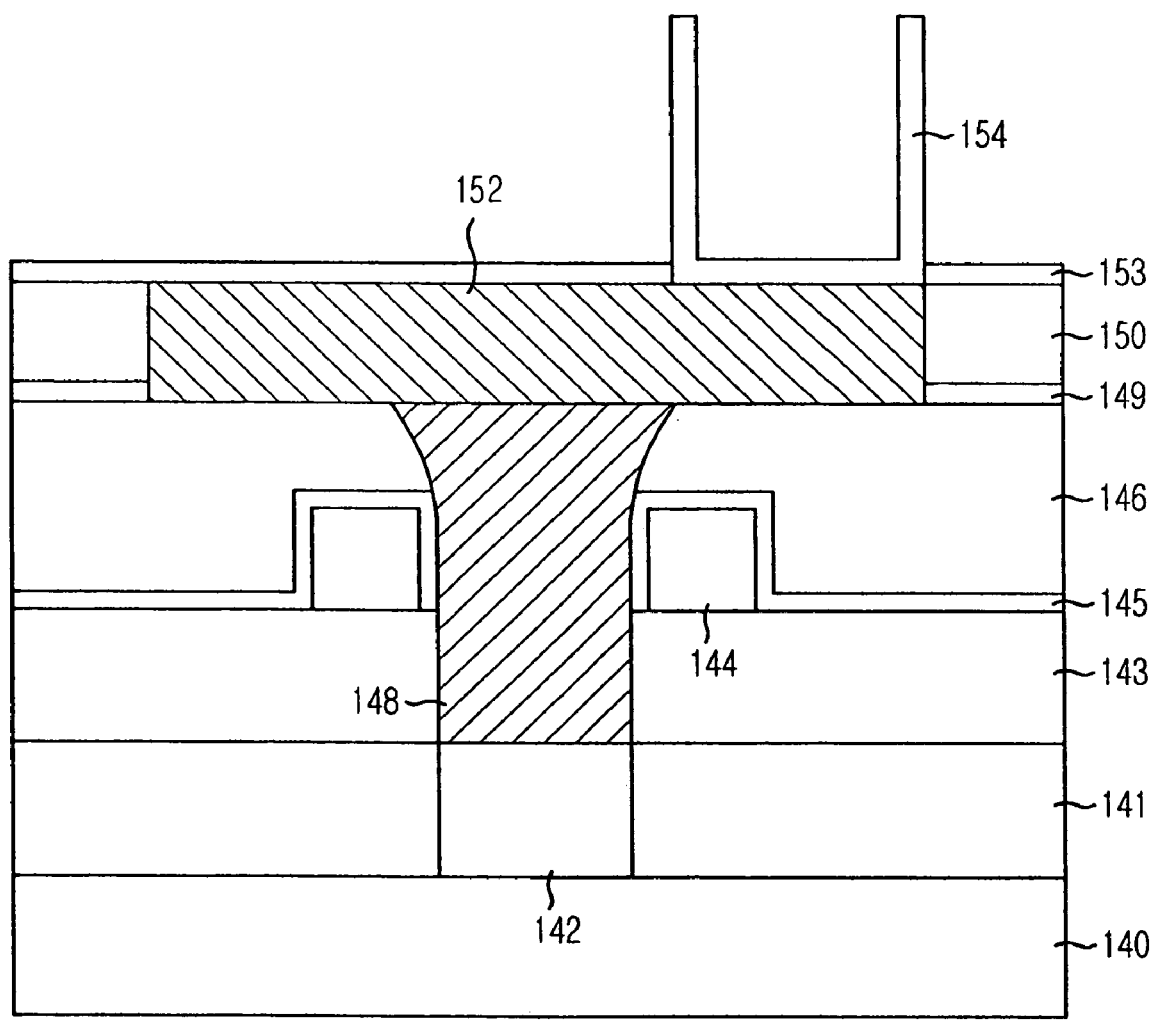

Continuously, as shown in FIG. 14D, the lower electrode 154 structure with a concave shape is formed by removing a remnant sacrifice insulation layer by performing the wet dip-out process using a solution mixed with BOE and HF, or H2SO4 and H2O2. For reference, a ratio of the BOC or HF, and H2SO4 or H2O2 is about 4 to 1.

Consequently, an area that the paired lower electrodes face each other in opposite direction is reduced by the aforementioned mask pattern. Herein, the paired lower electrodes are located at both sides of the bit line. As a result, the interfacial tension is reduced by the wet etching solution used during the wet dip-out process, and the electrical short of the lower electrodes caused by the lifting phenomenon can be prevented.

Also, a reduction of the capacitance of the capacitor by the different etching properties of the major axis and the minor axis can be minimized. Furthermore, the leaning phenomenon of the lower electrodes can be prevented.

Continuously, a remnant photo-resist is removed by a dry strip process using O2/CF4/H2O/N2 or O2/N2 gas. A solvent liquid is used for removing by-products generated during the etching process and the remnant photo-resist.

As a next step, a heat treatment process may be carried out to recover a deteriorated property of the lower electrode caused by the etching process. At this time, another etching process using the BOE is accompanied for a short time so as to remove impurities again before forming the dielectric layer.

In case of applying a MPS process to forming the lower electrode 154, the MPS is grown only on a inner face of the lower electrode 154 by controlling appropriate temperature and pressure conditions after depositing the poly-silicon. The CMP process is then carried out.

Even if not illustrated, a series of processes for forming the capacitor are eventually completed after forming the dielectric layer and an upper electrode on the lower electrode 154.

Figure 15:
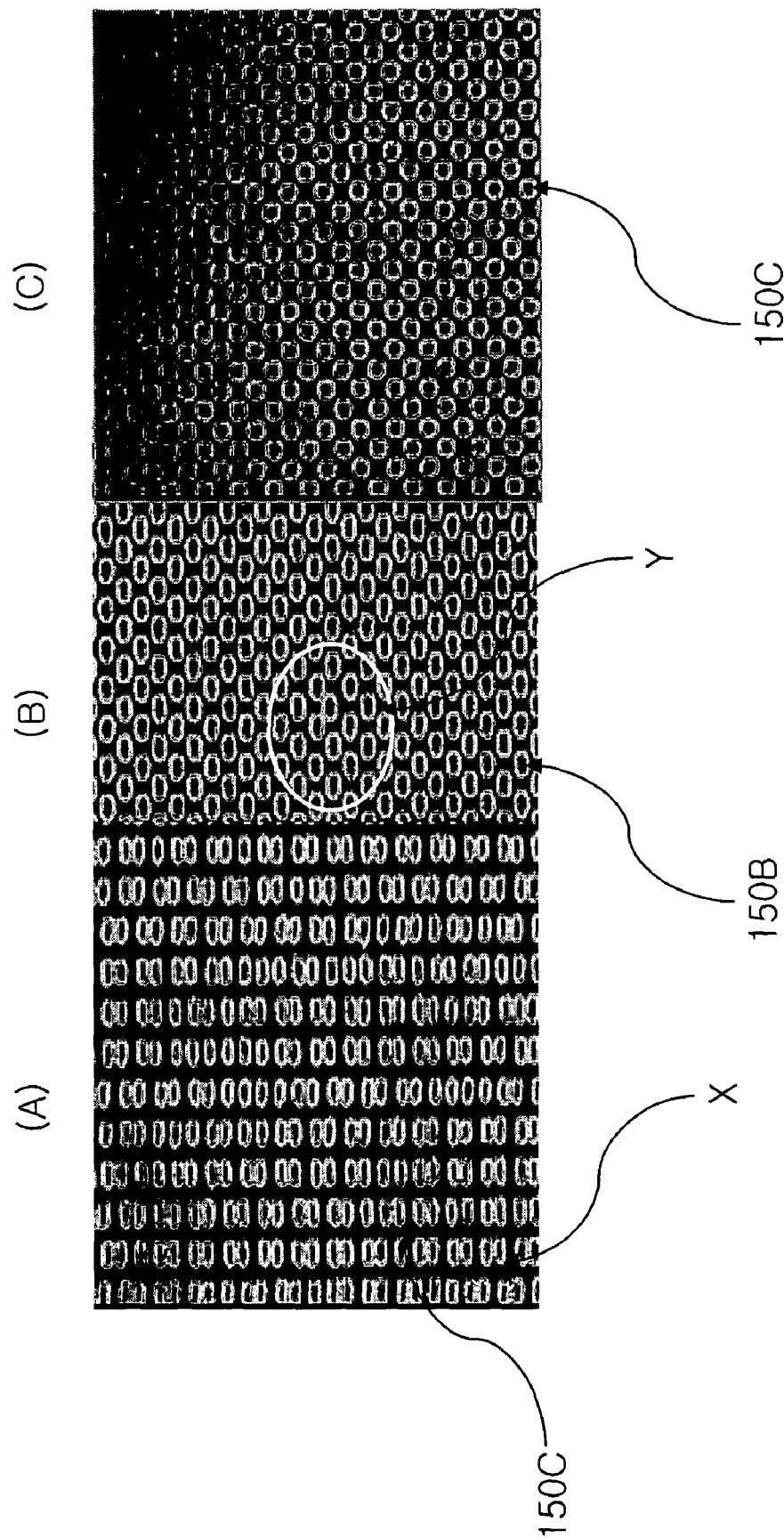
FIG. 15 is Transmission Electron Microscope (TEM) pictures showing a leaning phenomenon occurring between lower electrodes.

FIG. 15 is a Transmission Electron Microscope (TEM) picture showing the leaning phenomenon of the lower electrodes after finishing the wet dip-out process.

(A) of FIG. 15 shows the pattern collapse of the lower electrodes in accordance with the prior art.

(B) of FIG. 15 shows that the pattern collapse of the lower electrodes in accordance with the improved prior art.

As shown, the pattern collapse of the lower electrodes are still found.

(C) of FIG. 15 shows no pattern collapse of the lower electrodes in accordance with the present invention.

Figure 16:
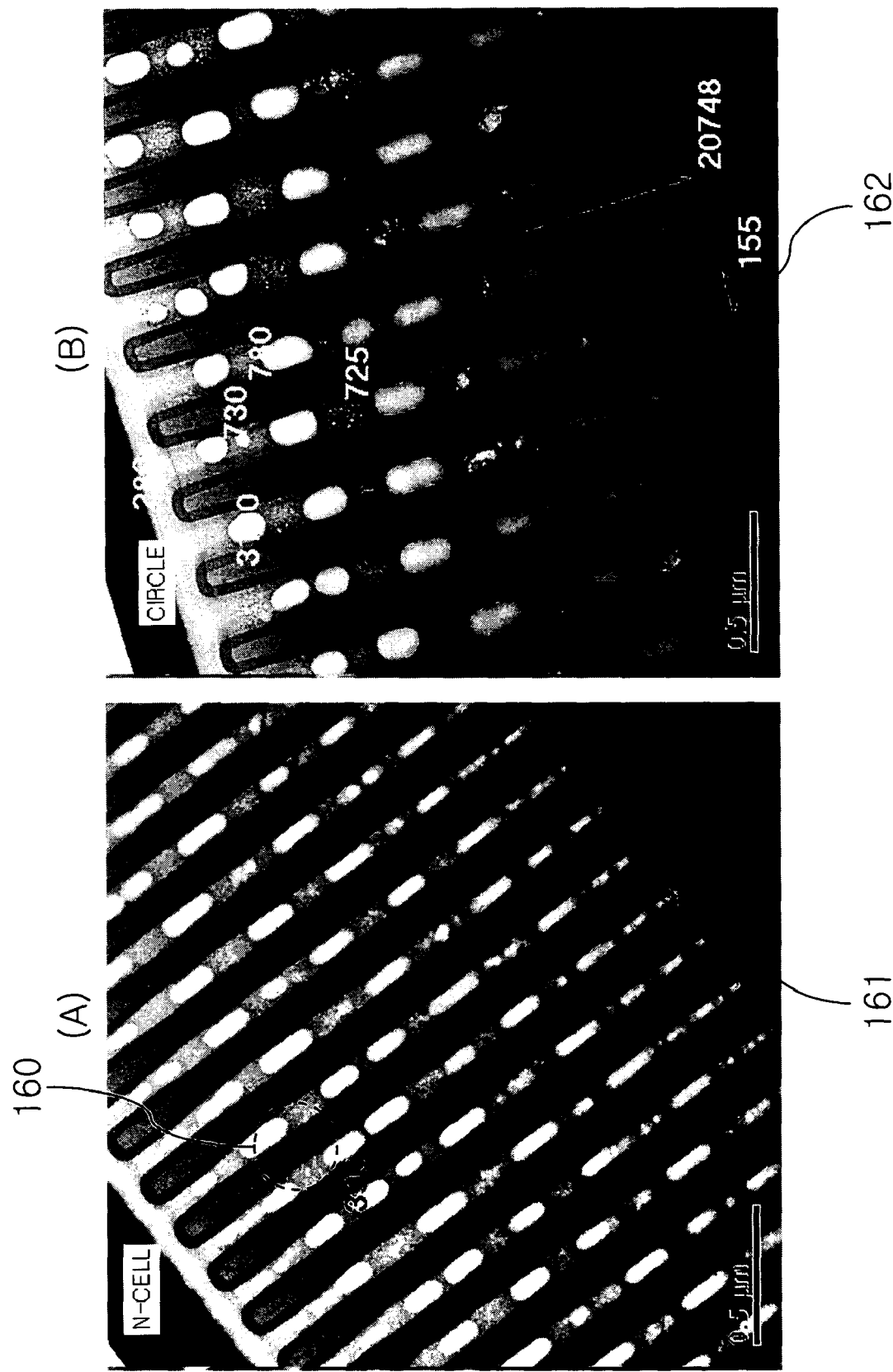
FIG. 16 is TEM pictures illustrating a disclosed lower electrode pattern.

FIG. 16 is a TEM picture illustrating a lower electrode pattern in accordance with the improved prior and the present art.

As shown in (A), a bowing phenomenon of the lower electrodes indicated with a reference mark '160' is generated to the lower electrodes. Also, a critical dimension 162 of the lower plane of the lower electrode is smaller than that of the upper plane of the lower electrode.

(B) of FIG. 16 shows that no bowing phenomenon is found and a critical dimension 162 of the lower plane of the lower electrode is substantially improved compared with that of the lower plane of the lower electrode.

As a result, not only the lifting phenomenon but also, the capacitance of the lower electrode is substantially improved.

In conclusion, an improvement for preventing the bridge phenomenon occurring between the lower electrodes and increasing the capacitance of the same is disclosed.

In addition, the paired lower electrodes are located at both sides of the bit line and disposed in the zigzag distribution. Consequently, the area that the paired lower electrodes face each other in opposite direction is reduced. As a result, the short of the paired lower electrode caused by the interfacial tension generated during performing the wet dip-out process is prevented. Also, to reduce contact resistance, the paired lower electrodes are disposed in the zigzag distribution or the contact pads are formed over the upper plane of the capacitor plug.

What is claimed is:

1. A semiconductor device, comprising:
a plurality of capacitor plugs formed within a predetermined interval interleaved between two bit lines and midpoints of capacitor plugs are located at inter-section points of X axis virtual line and Y axis virtual line, wherein the X axis virtual lines are parallel with the bit lines and the Y axis virtual lines are perpendicular to the X axis virtual lines;
a plurality of lower electrodes of capacitors formed within a predetermined interval to be respectively connected with the capacitor plugs in one to one correspondence, each lower electrode being octagonally or circularly shaped; and
a plurality of contact pads formed between the lower electrodes and the capacitor plugs, wherein the contact pads are formed over the capacitor plugs and disposed at a lower plane of at least one of the paired lower electrodes.

2. The semiconductor device as recited in claim 1, wherein a midpoint of the contact pad is located at an upper plane of the capacitor plug along one of two X virtual axes which is adjacent to each other.

3. The semiconductor device as recited in claim 2, wherein a midpoint of the contact pad is deviated from the midpoint of a corresponding capacitor plug but located at a midpoint of the corresponding lower electrode.

4. The semiconductor device as recited in claim 2, wherein a midpoint of the contact pad is located at a midpoint of the corresponding lower electrode and the lower electrode corresponding to the contact pad and another lower electrode which is adjacent to the lower electrode corresponding to the contact pad along the Y virtual axis are disposed at positions deviated from the Y virtual axis in an opposite direction.

5. The semiconductor device as recited in claim 2, wherein size of the upper plane of the contact pad is greater than that of the upper plane of the capacitor plug.

6. The semiconductor device as recited in claim 1, wherein a lower electrode and neighbored lower electrode disposed along a direction of Y virtual axis line are formed not to have overlapped area or to have minimum overlapped area, if one of lower electrode is moved to same X virtual axis line of the other lower electrode.

7. The semiconductor device as recited in claim 1, wherein a lower electrode and neighbored lower electrode disposed along a direction of Y virtual axis are not on same Y virtual axis.

8. The semiconductor device as recited in claim 1, wherein the midpoints of a lower electrode and the neighbored lower electrode are not disposed along same Y virtual axis.

9. The semiconductor device as recited in claim 1, wherein a ratio of a major axis to a minor axis of the upper plane of the lower electrodes ranges from about 1 to 1 to about 2 to 1.

10. The semiconductor device as recited in claim 1, wherein an area of an upper plane of a lower electrode is practically identical to that of a lower plane of the lower electrode in view of a three-dimensional structure and the lower electrode features an octagonal or a circular cylinder structure having a lateral plane connecting the upper plane with the lower plane, wherein the lateral plane is practically vertical to the upper plane and low plane respectively.

11. A method for fabricating a semiconductor device, comprising:
    forming a plurality of capacitor plugs within a predetermined interval interleaved between two bit lines by arranging midpoints of capacitor plugs located at intersection points of X axis virtual line and Y axis virtual line, wherein the X axis virtual lines are parallel with the bit lines and the Y axis virtual lines are perpendicular to the X axis virtual lines;
    forming a plurality of lower electrodes of capacitors within a predetermined interval to be respectively connected with the capacitor plugs in one to one correspondence, each lower electrode being octagonally or circularly shaped; wherein forming the plurality of lower electrodes comprises:
    depositing a sacrifice insulation layer over the capacitor plug formed over a semiconductor substrate;
    forming a plurality of open parts exposing the capacitor plugs by performing an selective etching of the sacrifice insulation layer by using a mask pattern;
    depositing a material for the lower electrode on an entire profile of the semiconductor substrate comprising the open parts;
    forming the lower electrodes separated from each other by performing a planerization process until the sacrifice insulation layer is exposed; and
    removing the sacrifice insulation layer by carrying out a wet dip-out process.

12. The method as recited in claim 11, wherein the mask pattern having an open part and neighbored open part disposed along a direction of the Y virtual axis line are formed not to have overlapped area or to have minimum overlapped area, if the open part is moved to the same X virtual axis line as the other open part.

13. The method as recited in claim 12, wherein the mask pattern having the open part and neighbored open part disposed along a direction of the Y virtual axis are not on the same Y virtual axis.

14. The method as recited in claim 12, wherein the mask pattern having the open part and the neighbored open part are not disposed along the same Y virtual axis.

15. The method as recited in claim 12, wherein the open part of the mask pattern features an octagonal or a circular shape and a ratio of a major axis to a minor axis of the open part ranges from about 1 to 1 to about 2 to 1.

16. A method for fabricating a semiconductor device, comprising:
    forming a plurality of capacitor plugs within a predetermined interval interleaved between two bit lines by arranging midpoints of capacitor plugs located at intersection points of X axis virtual line and Y axis virtual line, wherein the X axis virtual lines are parallel with the bit lines and the Y axis virtual lines are perpendicular to the X axis virtual lines; and
    forming a plurality of lower electrodes of capacitors within a predetermined interval to be respectively connected with the capacitor plugs in one to one correspondence, each lower electrode being octagonally or circularly shaped;
    wherein a plurality of contact pads are respectively formed between the lower electrodes and the capacitor plugs after forming the capacitor plugs, wherein the contact pads serve as connecting the lower electrode with the capacitor plug electrically.

17. The method as recited in claim 16, wherein the contact pads are formed over the capacitor plugs and midpoints of the contact pads are located at a lower plane of at least one of the paired lower electrodes along the X virtual axis.

18. The method as recited in claim 17, wherein the midpoints of the contact pads are deviated from the midpoints of corresponding capacitor plugs and respectively located at midpoints of corresponding lower electrodes.

19. The method as recited in claim 17, wherein a midpoint of the contact pad is located at a midpoint of the corresponding lower electrode and the lower electrode corresponding to the contact pad and an adjacent lower electrode found along the Y virtual axis are disposed in a way crossing each other.

20. The method as recited in claim 17, wherein size of the upper plane of the contact pad is greater than that of the upper plane of the capacitor plug.

21. The method as recited in claim 16, wherein the contact pads are disposed on upper planes of the capacitor plugs of which midpoints are located along one of a pair of X virtual axes adjacent to each other.

* * * * *